(12) United States Patent
Daicho et al.

(10) Patent No.: US 11,402,077 B2
(45) Date of Patent: Aug. 2, 2022

(54) FLUORESCENT MEMBER AND LIGHT-EMITTING MODULE

(71) Applicant: KOITO MANUFACTURING CO., LTD., Tokyo (JP)

(72) Inventors: Hisayoshi Daicho, Shizuoka (JP); Yu Shinomiya, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 961 days.

(21) Appl. No.: 16/132,538

(22) Filed: Sep. 17, 2018

(65) Prior Publication Data
US 2019/0032886 A1    Jan. 31, 2019

Related U.S. Application Data

(63) Continuation of application No. PCT/JP2017/010261, filed on Mar. 14, 2017.

(30) Foreign Application Priority Data

Mar. 18, 2016  (JP) .............................. JP2016-055451
Mar. 18, 2016  (JP) .............................. JP2016-055452
Mar. 18, 2016  (JP) .............................. JP2016-055453

(51) Int. Cl.
*F21V 5/00* (2018.01)
*F21V 9/30* (2018.01)
(Continued)

(52) U.S. Cl.
CPC ................ *F21V 5/00* (2013.01); *C01B 21/00* (2013.01); *C01F 1/00* (2013.01); *C03C 1/00* (2013.01);
(Continued)

(58) Field of Classification Search
CPC .......... F21V 13/08; F21V 29/763; F21V 5/10; F21V 7/00; F21V 9/30
(Continued)

(56) References Cited

U.S. PATENT DOCUMENTS

2009/0256163 A1   10/2009  Chakraborty
2013/0056775 A1    3/2013  Kawakami
(Continued)

FOREIGN PATENT DOCUMENTS

CN          102057511 A      5/2011
CN          102800791 A     11/2012
(Continued)

OTHER PUBLICATIONS

Office Action dated Sep. 2, 2020, by the Chinese Patent Office in corresponding Chinese Patent Application No. 201780017964.9 and English translation of the Office Action. (21 pages).
(Continued)

*Primary Examiner* — William J Carter
(74) *Attorney, Agent, or Firm* — Buchanan Ingersoll & Rooney PC

(57) ABSTRACT

A fluorescent member includes: a wavelength converter including an incidence part on which a light of a light source is incident and an output part from which a converted light subjected to wavelength conversion as a result of excitation by an incident light is output; and a reflecting part provided in at least a portion of a surface of the wavelength converter. The wavelength converter is comprised of a material whereby a degree of scattering of the light of the light source incident via the incidence part and traveling toward the output part is smaller than in the case of a polycrystalline material.

15 Claims, 11 Drawing Sheets

(51) Int. Cl.
| | |
|---|---|
| *F21V 8/00* | (2006.01) |
| *F21Y 115/30* | (2016.01) |
| *F21Y 115/10* | (2016.01) |
| *G02B 5/20* | (2006.01) |
| *H01S 5/022* | (2021.01) |
| *H01L 33/50* | (2010.01) |
| *C04B 35/645* | (2006.01) |
| *F21K 9/61* | (2016.01) |
| *C03C 1/00* | (2006.01) |
| *C04B 35/44* | (2006.01) |
| *F21K 9/64* | (2016.01) |
| *C04B 35/195* | (2006.01) |
| *C04B 35/626* | (2006.01) |
| *C30B 29/00* | (2006.01) |
| *C09K 11/08* | (2006.01) |
| *C01B 21/00* | (2006.01) |
| *C01F 1/00* | (2006.01) |

(52) U.S. Cl.
CPC ............ *C04B 35/195* (2013.01); *C04B 35/44* (2013.01); *C04B 35/6263* (2013.01); *C04B 35/6265* (2013.01); *C04B 35/6455* (2013.01); *C09K 11/08* (2013.01); *C30B 29/00* (2013.01); *F21K 9/61* (2016.08); *F21K 9/64* (2016.08); *F21V 9/30* (2018.02); *G02B 5/20* (2013.01); *H01L 33/50* (2013.01); *H01L 33/502* (2013.01); *H01S 5/022* (2013.01); *C04B 2235/3208* (2013.01); *C04B 2235/3213* (2013.01); *C04B 2235/3225* (2013.01); *C04B 2235/3229* (2013.01); *C04B 2235/444* (2013.01); *C04B 2235/5445* (2013.01); *C04B 2235/764* (2013.01); *C04B 2235/95* (2013.01); *C04B 2235/9653* (2013.01); *F21Y 2115/10* (2016.08); *F21Y 2115/30* (2016.08); *G02B 6/0003* (2013.01)

(58) Field of Classification Search
USPC .................................................. 362/551–582
See application file for complete search history.

(56) References Cited

U.S. PATENT DOCUMENTS

| | | | |
|---|---|---|---|
| 2016/0033109 A1* | 2/2016 | York | ................... G02B 6/0046 362/555 |
| 2016/0043289 A1 | 2/2016 | Inomata et al. | |

FOREIGN PATENT DOCUMENTS

| | | |
|---|---|---|
| CN | 105283526 A | 1/2016 |
| JP | H041615 | 1/1992 |
| JP | 2005-033211 | 2/2005 |
| JP | 2012-062459 | 3/2012 |
| JP | 2013-038353 | 2/2013 |
| JP | 2013-207049 | 10/2013 |
| JP | 2014-067961 | 4/2014 |
| JP | 2014-140015 | 7/2014 |
| JP | 2015-081313 | 4/2015 |
| JP | 2015-166787 | 9/2015 |
| JP | 2016-027613 | 2/2016 |
| WO | 2014/125782 | 8/2014 |
| WO | 2015169270 A2 | 11/2015 |

OTHER PUBLICATIONS

Extended European Search Report and Opinion dated Oct. 17, 2019 in corresponding European Patent Application No. 17766694.8-1015, 10 pages.

Communication pursuant to Article 94(3) EPC issued by the European Patent Office in corresponding European Patent Application No. 17766694.8-1015 dated Jul. 13, 2020 (7 pages).

Notification of Reasons for Refusal issued by the Japanese Patent Office in corresponding Japanese Patent Application No. 2018-505960 dated Jun. 23, 2020 (12 pages including partial English translation).

International Search Report on corresponding PCT Application No. PCT/JP2017/010261, dated Jun. 20, 2017.

International Preliminary Report on Patentability on corresponding PCT Application No. PCT/JP2017/010261, dated Sep. 18, 2018.

* cited by examiner

FLUORESCENT MEMBER AND LIGHT-EMITTING MODULE

CROSS-REFERENCE TO RELATED APPLICATIONS

This application is based upon and claims the benefit of priority from the prior Japanese Patent Application No. 2016-55451, filed on Mar. 18, 2016, Japanese Patent Application No. 2016-55452, filed on Mar. 18, 2016, Japanese Patent Application No. 2016-55453, filed on March 18 and International Patent Application No. PCT/JP2017/010261, filed on Mar. 14, 2017, the entire content of each of which is incorporated herein by reference.

BACKGROUND OF THE INVENTION

Field of the Invention

The present invention relates to a fluorescent member and a light emitting module.

(1) Light emitting modules of a structure including a combination of a semiconductor laser light source and a phosphor are proposed (see patent document 1). Often, the phosphor mentioned above is a polycrystal. In that case, the light emitted from the semiconductor light emitting device is scattered and shielded in the phosphor, and the phosphor excited by the light converts the wavelength to produce a Lambertian emission pattern. Therefore, the directionality of the light emitted from the light emitting module is lowered. As a result, the light utilized in the optical system is reduced and the efficiency of using the light in the whole system including the light emitting module is lowered.

In this background, translucent ceramic phosphors and monocrystal phosphors are proposed to reduce the loss incurred due to the scattering and shielding of light incident on the phosphor (see patent documents 2, 3).

There is also proposed a light emitting module including a light emitting device that emits an ultraviolet light or a short-wavelength visible light, a molding member that seals the light emitting device, and a phosphor excited by the ultraviolet light or the short-wavelength visible light emitted by the light emitting device to emit a visible light of blue, yellow, etc. The molding member of the light emitting module includes a high diffusion layer in which a phosphor is at least mixed, and which diffuses the light from the phosphor widely and includes a low diffusion layer in which the degree of diffusion is lower than in the high diffusion layer (see patent document 4).

(2) Also, a vehicle lamp in which a desired color of emitted light is obtained by combining a light emitting device such as a light emitting diode (LED) and a laser diode (LD) with a phosphor excited by the light emitted by the light emitting device and outputting a light subjected to wavelength conversion is proposed (patent document 5).

In a phosphor, it is difficult to avoid heat generation due to the Stoke's loss. In particular, it is obvious that the amount of heat generated is increased when a high-output light emitting device is used and that some measures for heat dissipation will be required. In the case of the aforementioned vehicle lamp, for example, the light emitting member including the phosphor is housed in a part of the support member formed by a material such as aluminum, and the heat generated by the phosphor is dissipated outside via the support member.

[patent document 1] JP2014-067961
[patent document 2] JP2012-062459
[patent document 3] JP2015-081313
[patent document 4] JP2013-38353
[patent document 5] WO2014/125782 pamphlet (1) It should be noted that the converted light emitted by the phosphor itself exhibits a non-directional Lambertian light distribution pattern as described above. Therefore, highly directional light cannot be obtained absent any measures.

(2) Further, a light emitting member in which phosphor particles are dispersed in a resin is non-directional and emits light uniformly in all directions. Therefore, a portion of the light emitting surface is covered in the presence of a heat dissipating member around. Consequently, the efficiency of using the light is lowered. Still further, an increase in the temperature of the phosphor grows phonon oscillation inside the phosphor. Consequently, the excitation energy absorbed in the phosphor is not turned into light emission and is moderated by the phonon oscillation, resulting in a lower light emission efficiency.

SUMMARY OF THE INVENTION

The present invention addresses the above-described issue and an illustrative purpose thereof is to provide a fluorescent member capable of emitting highly directional light. Another illustrative purpose is to provide a technology for inhibiting the light emission efficiency of a light emitting module from being lowered.

A fluorescent member according to an embodiment of the present invention includes: a wavelength converter including an incidence part on which a light of a light source is incident and an output part from which a converted light subjected to wavelength conversion as a result of excitation by an incident light is output; and a reflecting part provided in at least a portion of a surface of the wavelength converter. The wavelength converter is comprised of a material whereby a degree of scattering of the light of the light source incident via the incidence part and traveling toward the output part is smaller than in the case of a polycrystalline material.

Another embodiment of the present invention relates to a light emitting module. The light emitting module includes a light source; and a wavelength converter including an incidence part on which a light of the light source is incident and an output part from which a converted light subjected to wavelength conversion as a result of excitation by an incident light is output. The wavelength converter is comprised of a material whereby a degree of scattering of the light of the light source incident via the incidence part and traveling toward the output part is smaller than in the case of a polycrystalline material.

Another embodiment of the present invention also relates to a light emitting module. A light emitting module includes: a light source; a wavelength converter including an incidence part on which a light of the light source is incident, an output part from which a converted light subjected to wavelength conversion as a result of excitation by an incident light is output and a side surface different from the incidence part and the output part; and a heat dissipation part provided to cover at least a portion of the side surface. The wavelength converter is configured to impart directionality to the light of the light source incident via the incidence part.

A fluorescent member according to another embodiment of the present invention includes: a first wavelength converter including a first incidence part on which a light of a light source is incident and a first output part from which a converted light of a first color subjected to wavelength conversion as a result of excitation by an incident light is output; and a second wavelength converter including a second incidence part on which a light of a light source is incident and a second output part from which a converted light of a second color subjected to wavelength conversion as a result of excitation by an incident light is output. The first wavelength converter is comprised of a material whereby a degree of scattering of the light of the light source incident via the first incidence part and traveling toward the first output part is smaller than in the case of a polycrystalline material, and the second wavelength converter is comprised of a material whereby a degree of scattering of the light of the light source incident via the second incidence part and traveling toward the second output part is smaller than in the case of a polycrystalline material.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
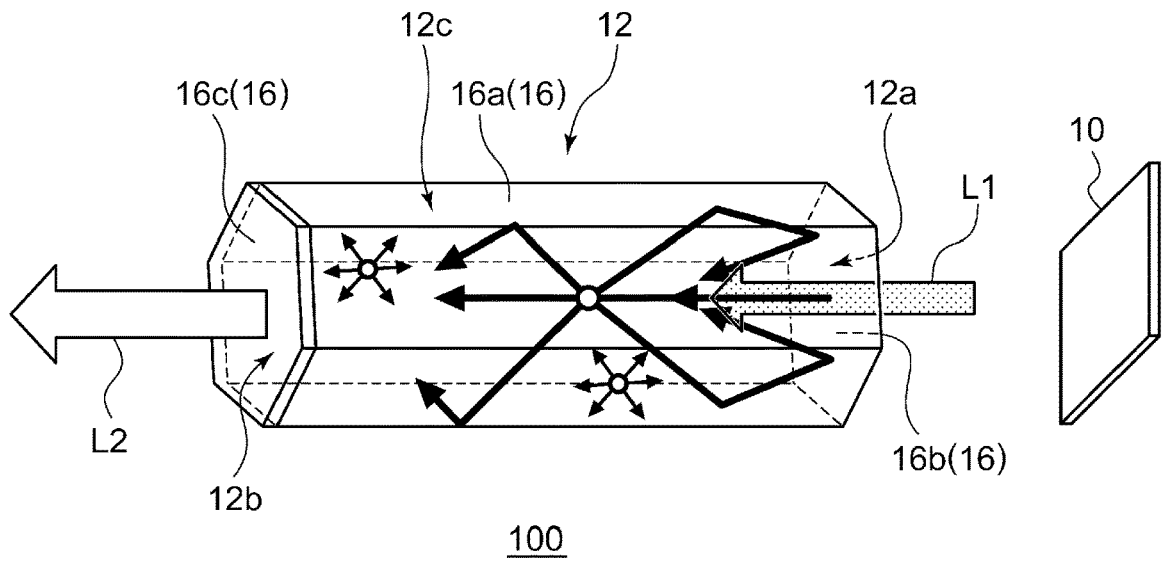
FIG. 1 is a schematic drawing showing a light emitting module according to the first embodiment.

A fluorescent member according to an embodiment of the present invention includes: a wavelength converter including an incidence part on which a light of a light source is incident and an output part from which a converted light subjected to wavelength conversion as a result of excitation by an incident light is output; and a reflecting part provided in at least a portion of a surface of the wavelength converter. The wavelength converter is comprised of a material whereby a degree of scattering of the light of the light source incident via the incidence part and traveling toward the output part is smaller than in the case of a polycrystalline material.

According to this embodiment, the proportion of the light traveling from the incidence part toward the output part in the wavelength converter is increased, and the directionality of the light emitted from the output part is enhanced since the wavelength converter is comprised of a material whereby a degree of scattering of the light of the light source incident via the incidence part and traveling toward the output part is smaller than in the case of a polycrystalline material. Further, the light that would have leaked outside from a portion of the surface in the related art is internally reflected by the reflecting part and is output from the output part so that the efficiency of using the light is improved.

The wavelength converter may be a rod-shaped member where the incidence part and the output part are formed at respective ends of the member in a longitudinal direction. The feature aligns the directions of the light incident via the incidence part as it passes through the rod-shaped member, enhancing the directionality of the light emitted from the output part.

An aspect ratio of the wavelength converter may be several tens of nanometers (nm).

The wavelength converter may be shaped in a polygonal column or a cylinder, and the reflecting part may be provided on a side surface different from the incidence part and the output part. The feature allows the light that would have leaked outside from the side surface in the related art to be internally reflected by the side surface so that the efficiency of using the light is improved.

The wavelength converter may be made of a monocrystal material or a ceramic material, and an angle formed by a principal axis of the monocrystal material or the ceramic material and a straight line connecting the incidence part and the output part may be within ±5°. The feature further enhances the directionality of the light emitted from the output part.

Another embodiment of the present invention relates to a light emitting module. The light emitting module includes a light source; and a wavelength converter including an incidence part on which a light of the light source is incident and an output part from which a converted light subjected to wavelength conversion as a result of excitation by an incident light is output. The wavelength converter is comprised of a material whereby a degree of scattering of the light of the light source incident via the incidence part and traveling toward the output part is smaller than in the case of a polycrystalline material.

According to this embodiment, the proportion of the light traveling from the incidence part toward the output part in the wavelength converter is increased, and the directionality of the light emitted from the output part is enhanced since the wavelength converter is comprised of a material whereby a degree of scattering of the light of the light source incident via the incidence part and traveling toward the output part is smaller than in the case of a polycrystalline material.

The wavelength converter may be a rod-shaped member where the incidence part and the output part are formed at respective ends of the member in a longitudinal direction. The feature aligns the directions of the light incident via the incidence part as it passes through the rod-shaped member, enhancing the directionality of the light emitted from the output part.

An aspect ratio of the wavelength converter may be several tens of nanometers (nm).

The light emitting module may further include a reflecting part provided in at least a portion of a surface of the wavelength converter. The wavelength converter may be shaped in a polygonal column or a cylinder, and the reflecting part may be provided on a side surface different from the incidence part and the output part. The feature further improves the efficiency of using the light.

The wavelength converter may be made of a monocrystal material or a ceramic material, and an angle formed by a principal axis of the monocrystal material or the ceramic material and a light axis of the light source may be within ±5°. The feature further enhances the directionality of the light emitted from the output part.

Another embodiment of the present invention also relates to a light emitting module. A light emitting module includes: a light source; a wavelength converter including an incidence part on which a light of the light source is incident, an output part from which a converted light subjected to wavelength conversion as a result of excitation by an incident light is output and a side surface different from the incidence part and the output part; and a heat dissipation part provided to cover at least a portion of the side surface. The wavelength converter is configured to impart directionality to the light of the light source incident via the incidence part.

This reduces the proportion of the light emitted from the side surface of the wavelength converter so that the amount of light shielded by the heat dissipation part is reduced and the proportion of the light contributing to the light distribution by the light emitting module is increased accordingly.

A material having a thermal conductivity of 50 [W/(m·K)] or higher may be used for the heat dissipation part. The feature improves the heat dissipation performance of the heat dissipation part.

The light emitting module may further include a reflecting part provided between the side surface and the heat dissipation part. The reflecting part may be configured to internally reflect the light of the light source incident on the wavelength converter, and a material having a visible light reflectance of 80% or higher may be used for the reflecting part. The feature allows the light that would have leaked outside from a portion of the side surface in the related art to be internally reflected by the reflecting part and is output from the output part so that the efficiency of using the light is improved.

The wavelength converter may be comprised of a material whereby a degree of scattering of the light of the light source incident via the incidence part and traveling toward the output part is smaller than a degree of the light of the light source incident via the incidence part and traveling toward the side surface.

The wavelength converter may be a rod-shaped member where the incidence part and the output part are formed at respective ends of the member in a longitudinal direction. The feature aligns the directions of the light incident via the incidence part as it passes through the rod-shaped member, enhancing the directionality of the light emitted from the output part.

An aspect ratio of the wavelength converter may be several tens of nanometers (nm).

The wavelength converter may be shaped in a polygonal column or a cylinder.

The wavelength converter may be made of a monocrystal material or a ceramic material, and an angle formed by a principal axis of the monocrystal material or the ceramic material and a straight line connecting the incidence part and the output part may be within ±5°. The feature further enhances the directionality of the light emitted from the output part.

A fluorescent member according to another embodiment of the present invention includes: a first wavelength converter including a first incidence part on which a light of a light source is incident and a first output part from which a converted light of a first color subjected to wavelength conversion as a result of excitation by an incident light is output; and a second wavelength converter including a second incidence part on which a light of a light source is incident and a second output part from which a converted light of a second color subjected to wavelength conversion as a result of excitation by an incident light is output. The first wavelength converter is comprised of a material whereby a degree of scattering of the light of the light source incident via the first incidence part and traveling toward the first output part is smaller than in the case of a polycrystalline material, and the second wavelength converter is comprised of a material whereby a degree of scattering of the light of the light source incident via the second incidence part and traveling toward the second output part is smaller than in the case of a polycrystalline material.

According to this embodiment, the proportion of the light traveling from the first incidence part toward the first output part in the first wavelength converter is increased, and the directionality of the converted light of the first color emitted from the first output part is enhanced since the first wavelength converter is comprised of a material whereby a degree of scattering of the light of the light source incident via the first incidence part and traveling toward the first output part is smaller than in the case of a polycrystalline material. Further, the proportion of the light traveling from the second incidence part toward the second output part in the second wavelength converter is increased, and the directionality of the converted light of the second color emitted from the second output part is enhanced since the second wavelength converter is comprised of a material whereby a degree of scattering of the light of the light source incident via the second incidence part and traveling toward the second output part is smaller than in the case of a polycrystalline material. By mixing the converted light of the first color and the converted light of the second color different from the first color, emission of highly directional light of any of a variety of colors not realized by a single color is enabled.

The first wavelength converter is a rod-shaped member where the first incidence part is formed at one end of the member in a longitudinal direction, and the first output part is formed at the other end of the member in the longitudinal direction, and the second wavelength converter is a rod-shaped member where the second incidence part is formed at one end of the member in a longitudinal direction, and the second output part is formed at the other end of the member in the longitudinal direction. The feature aligns the directions of the light incident via the respective incidence parts as it passes through the respective rod-shaped members, enhancing the directionality of the light emitted from the respective output parts.

The first wavelength converter may be a tubular member, and the second wavelength converter may be provided in a hole of the first wavelength converter. The feature realizes a compact fluorescent member provided with two types of wavelength converters.

An aspect ratio of the first wavelength converter is 10 or higher, and an aspect ratio of the second wavelength converter is 10 or higher. The feature realizes a fluorescent member elongated and exhibiting high directionality.

The first wavelength converter may be a columnar member, the second wavelength converter may be a columnar member, and the first wavelength converter and the second wavelength converter may be provided such that the first output part and the second incidence part face each other.

The first wavelength converter may be made of a monocrystal material or a ceramic material, and an angle formed by a principal axis of the monocrystal material or the ceramic material and a straight line connecting the first incidence part and the first output part is within ±5°. The feature further enhances the directionality of the light emitted from the first output part.

The second wavelength converter may be made of a monocrystal material or a ceramic material, and an angle formed by a principal axis of the monocrystal material or the ceramic material and a straight line connecting the second incidence part and the second output part is within ±5°. The feature further enhances the directionality of the light emitted from the second output part.

Another embodiment of the present invention relates to a light emitting module. The light emitting module may include: the light source and the fluorescent member as described above. The first incidence part and the second incidence part may be adjacent to each other and provided to face a light emitting surface of the light source.

Optional combinations of the aforementioned constituting elements, and implementations of the invention in the form of methods, apparatuses, systems, computer programs, data structures, and recording mediums may also be practiced as additional modes of the present invention.

In accordance with an embodiment of the present invention, a fluorescent member capable of emitting highly directional light is provided. In further accordance with the embodiment, the light emission efficiency of a light emitting module is inhibited from being lowered.

A description will be given of an embodiment of the present invention with reference to the drawings. In the explanations of the figures, the same elements shall be denoted by the same reference numerals, and duplicative explanations will be omitted appropriately.

A phosphor is generally comprised of a powdery polycrystal including a collection of very small monocrystals (crystallites) sized about several tens of nanometers (nm). Fluorescence of the phosphor is emission of non-directional light. An interface called crystal grain boundary is found between crystallites. Light is scattered and shielded at the interface. For this reason, the light of a semiconductor light emitting device cannot be output without loss.

Further, light emission in a phosphor occurs as a result of electron transition in a luminescent center element. Therefore, the phosphor emits light in a non-directional Lambertian pattern so that the light introduced into the optical system (use efficiency) is reduced and the system efficiency is lowered.

In this background, we have arrived at an idea of realizing a fluorescent member that exhibits high directionality in a desired direction by directing our attention to the following means.

(1: Formation of a Wavelength Converter by Using a Transparent Matrix that does not Shield the Light Traveling Straight)

As mentioned above, an interface called crystal grain boundary is found between crystallites in a polycrystalline phosphor. The interface makes it difficult to ensure that the light travels straight in a polycrystalline phosphor. In this regard, the following materials are suitable for a wavelength converter for the purpose of ensuring that the light travels straight.

[Monocrystal Phosphor]

A monocrystal phosphor has a structure in which crystal lattices and crystal axes are aligned as a whole. A monocrystal phosphor can be obtained by vapor phase epitaxy, phosphor melt epitaxy, solution growth in a solvent (flux), or hydrothermal growth.

[Nanocomposite Material]

A nanocomposite material is a glass ceramic in which fluorescent components of sizes ¼ the wavelength of fluorescent emission or smaller ($\varphi$ of about 100 nm or smaller) are dispersed.

[Translucent Ceramic Phosphor]

A translucent ceramic phosphor is obtained by molding a raw material including primary particles of 500 nm or smaller at a high density and sintering the molded product. A transparent matrix alone cannot impart directionality to non-directional fluorescent emission produced by electron transition in atoms. As will be described later, a directional wavelength converter can be realized by shaping the surface properly.

[2: Rod Structure Having a High Aspect Ratio Capable of Guiding Light in a Direction of Radiation]

To impart directionality to light emission, a rod-shaped phosphor having a high aspect ratio is preferable, the side along the direction of radiation being defined as a long side. A description will now be given of preferable ranges of the rod diameter (shorter side), the rod length (longer side), and the aspect ratio (longer side/shorter side).

It is preferable that the rod diameter is 3~500 µm, and, more preferably, 5~200 µm, to contain the light emitted in the direction of diffusion and guide the light in the longitudinal direction of the rod. By employing an elongated rod shape like this, the light can be guided in the longitudinal direction of the rod. If the rod diameter is 3 µm or smaller, the number of reflections occurring on the rod side surfaces as the light is guided in the longitudinal direction of the rod tends to increase so that the attenuation of light occurs easily. If the rod diameter is 500 µm or larger, on the other hand, the effect of light containment obtained is insufficient, and light diffusion in the rod cannot be suppressed so that it is not possible to obtain sufficiently high directionality.

From the perspective of enhancing the directionality, the rod length may be about 1~100 mm, and, more preferably, 1~60 mm. The preferable length depends on the density of the activator agent in the phosphor, though. Still more preferably, the rod length may be 1~10 mm, or, 1~5 mm. If the length is 1 mm or smaller, the light path length will be short, and it is not possible to obtain sufficient directionality. Also, the length of 1 mm or smaller results in a light path length not sufficient to induce absorption and conversion of excitation light for wavelength conversion. On the other hand, if the rod length is 10 mm or larger, and, in particular, 100 mm or larger, attenuation of light guided in the rod will be serious. In addition, the rod will break easily so that a problem with the strength is created.

It is preferable that the aspect ratio of the rod is several tens of nanometers (nm) in order to obtain high directionality. If the aspect ratio is 10 or smaller, the light cannot be guided in the longitudinal direction of the rod and the desired directionality cannot be obtained. If the aspect ratio is 100 or greater, attenuation of light occurs in the rod with the result that the light emission efficiency is lowered.

(3: Provision of Various Reflection Coatings on the Rod Surface (Containment of Light Other than that of a Radiation Direction Inside the Rod)).

The side surface of the rod is coated with a reflection coating to prevent excitation light (device light) and fluorescence (wavelength-converted light) from being emitted outside. The reflection coating is comprised of a total reflection coating made of a dielectric, a metal reflection coating that does not absorb visible light, or an enhanced reflection coating formed by a hybrid of a dielectric layer and a metal reflective layer.

A short pass filter that transmits excitation light from the semiconductor light emitting device but does not transmit light of a wavelength longer than that of the excitation light is provided on the incidence surface of the rod. Alternatively, a semitransmissive reflection coating having a reflectance of 50% or higher for the excitation light may be used. It is preferable that the profile irregularity of the incidence surface (e.g., arithmetic mean roughness Ra) is ¼ the wavelength of fluorescence or smaller.

A semitransmissive reflection coating for improving the light containment performance inside the rod may be provided on the output surface of the rod in order to enhance the directionality. It is preferable that the profile irregularity of the output surface (e.g., arithmetic mean roughness Ra) is ⅛ the peak wavelength of fluorescence or smaller. The output surface may alternatively be configured such that the interfacial refractive index is moderated by a motheye structure (subwavelength grating).

First Embodiment (Light Emitting Module>

A description will now be given of a light emitting module of a preferable configuration in which the above considerations are addressed. FIG. 1 is a schematic drawing showing a light emitting module according to the first embodiment. A light emitting module 100 includes a light emitting device 10 as a light source and a wavelength converter 12. A semiconductor light emitting device such as a light emitting diode (LED) device, a laser diode (LD) device, and an electro luminescence (EL) device may be suitably used as the light emitting device 10. Devices other than these may be used so long as a light source is capable of emitting highly directional light.

The wavelength converter 12 includes an incidence part 12a on which a light (excitation light) L1 emitted by the light emitting device 10 is incident, and an output part 12b from which a converted light L2 subjected to wavelength conversion as a result of the excitation by the incident light L1 is output.

A reflecting part 16 that internally reflects a portion of the converted light L2 subjected to wavelength conversion inside the wavelength converter 12 and the light L1 incident via the incidence part 12a of the wavelength converter 12 is provided in at least a portion of the surface of the wavelength converter 12. The reflecting part 16 according to the embodiment includes a reflection coating 16a provided on a side surface 12c connecting the incidence part 12a and the output part 12b of the wavelength converter 12, a short pass filter 16b provided on the surface of the incidence part 12a, and a reflection coating 16c provided on the surface of the output part 12b.

The short pass filter 16b is a filter that transmits most of the light of a wavelength shorter than a predetermined wavelength but does not transmit (reflects) most of the light of a predetermined wavelength or longer. The reflection coating 16c is configured not to reflect the entirety of the converted light L2 subjected to wavelength conversion but transmit at least a portion of the light. The reflecting part 16 may not necessarily be provided in all of the incidence part 12b, the output part 12b, and side surface 12c. The combination of the reflection coating 16a, the short pass filter 16b, and the reflection coating 16c (or absence thereof) may be selected as appropriate. For example, the reflection coating may be provided only on the side surface 12c, and nothing may be provided on the incidence part 12a or the output part 12b.

As mentioned above, a polycrystalline phosphor includes a collection of very small monocrystals (crystallites) sized about several tens of nanometers (nm), and an interface called crystal grain boundary is found between crystallites. Therefore, the light is heavily scattered and shielded at the interface. To address this, the wavelength converter 12 according to the embodiment is comprised of a material whereby the degree of scattering of the light of the light emitting device incident via the incidence part 12a and traveling toward the output part is smaller than in the case of a polycrystalline material. The degree of scattering can be defined as a proportion of the light of the light emitting device incident via the incidence part that is refracted or reflected. The smaller the proportion, the smaller the degree of scattering. Alternatively, the degree may be determined by knowing how much the direction of the light of the light emitting device incident via the incidence part and traveling toward the output part is changed as the light is scattered. For example, the degree of scattering will be smaller in the case the traveling direction of light is changed only by 10° than in the case the traveling direction of light is changed by 30° as the light is scattered.

The wavelength converter 12 according to the embodiment is comprised of a material whereby the degree of scattering of the light L1 of the light emitting device incident via the incidence part 12a and traveling toward the output part 12b is smaller than in the case of a polycrystalline material. Therefore, the proportion of the light traveling from the incidence part 12a toward the output part 12b is increased, and the directionality of the light output from the output part 12b is enhanced. In further accordance with the embodiment, the light that would have leaked outside from a portion of the surface in the related art is internally reflected and is output from the output part 12b so that the efficiency of using the light is improved.

Furthermore, the wavelength converter 12 is a rod-shaped member where the incidence part 12a is formed at one end of the member in the longitudinal direction, and the output part 12b is formed at the other end. The feature aligns the directions of the light incident via the incidence part 12a as it passes through the rod-shaped member, enhancing the directionality of the light emitted from the output part 12b. Thus, the wavelength converter 12 is configured to impart directionality to the light of the light emitting device 10 incident via the incidence part 12a.

Further, the wavelength converter 12 is a hexagonal prism, and the reflection coating 16c is provided on the side surface 12c different from the incidence part 12a and the output part 12b. The wavelength converter 12 may be shaped in a polygonal column or a cylinder. The feature allows the light that would have leaked outside from the side surface 12c to be reflected by the side surface 12c so that the efficiency of using the light is improved.

When the wavelength converter 12 is made of a monocrystal material or a ceramic material, the angle formed by the principal axis of the monocrystal material or the ceramic material and the straight line connecting the incidence part 12a and the output part 12b may preferably be within ±5°. More preferably, the angle may be within ±3°. The straight line connecting the incidence part 12a and the output part 12b may be defined, for example, as a straight line intersecting the incidence part and the output part that has the shortest length. Alternatively, the straight line may be defined as a normal to at least one of the incidence part and the output part that intersects the other surface. The principal axis is a direction in an optically anisotropic birefringent crystal in which incident light does not diverge and can be translated into a light axis. A uniaxial crystal belongs to a hexagonal system or a diametric system, and a biaxial crystal belongs to an orthorhombic system, a monoclinic system, or a triclinic system. An isotropic crystal (e.g., a crystal of a cubic system) does not have a principal axis. The above feature ensures that the more parallel the light is to the principal axis, the easier it is for the light to reach the output part 12b and so further enhances the directionality of the light emitted from the output part 12b.

A more detailed description of the features according to the embodiment will be given with reference to examples and comparative examples.

Example 1: A Chloroapatite Monocrystal Rod Used in the Phosphor

A description will first be given of a method of manufacturing a monocrystal rod made of an apatite phosphor. Starting materials including $CaCO_3$, $CaHPO_4 \cdot 2H_2O$, $Eu_2O_3$, $NH_4Cl$, and $CaCl_2$ were weighed such that the molar ratio thereof is $CaCO_3:CaHPO_4 \cdot 2H_2O:Eu_2O_3:NH_4Cl:CaCl_2=1.8:3.0:0.10:1.0:5.0$. The weighted materials were put into an alumina mortar to grind and mix the materials to obtain a base mixture. The base mixture was put into an alumina crucible and heated to 1200° C. at a rate of temperature increase of 100° C./h. The heated mixture was calcinated (synthesized) in an electrical furnace of a reductive atmosphere for 10 hours at a temperature of 1200° C. and in a predetermined atmosphere ($H_2:N_2=5:95$). The temperature was then lowered to 800° C. at a cooling rate 5° C./h. The mixture was then cooled naturally to obtain a calcinated product was. The calcinated product thus obtained was carefully cleaned with hot pure water and was filtered. The filtered product was dried for 1 hour at 120° C. to obtain a phosphor 1.

Figure 2:
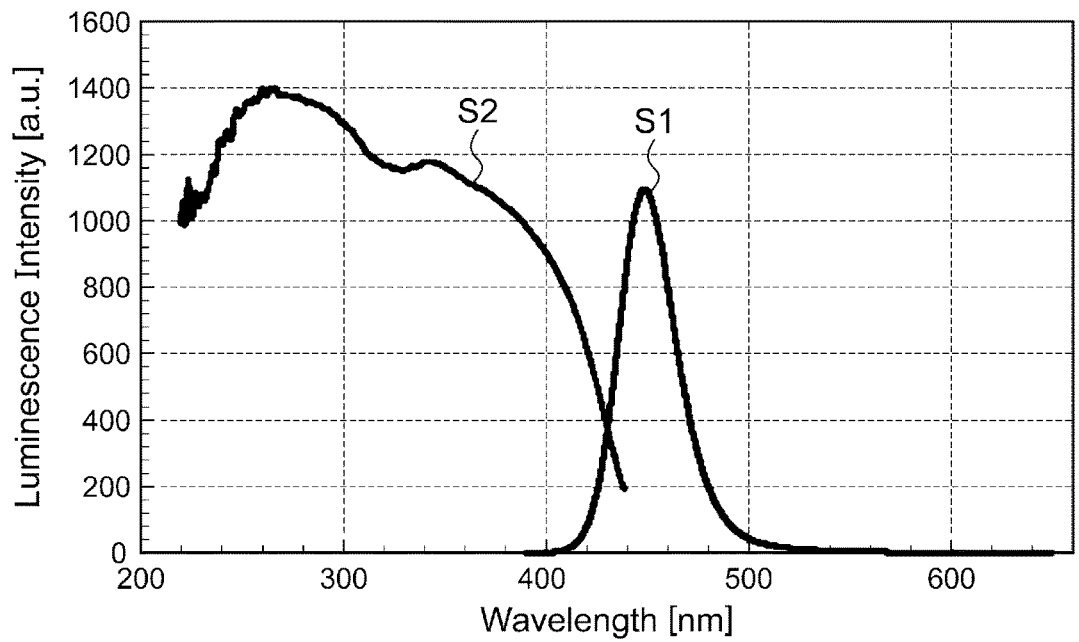
FIG. 2 is a graph showing an emission spectrum and an excitation spectrum of the phosphor 1.

The composition of the phosphor 1 is $Ca_5(PO_4)_3Cl:Eu^{2+}$. The phosphor is a hexagonal prism monocrystal having a diameter φ of 200 μm and a length of 10 mm and grown in the direction of the c-axis. FIG. 2 is a graph showing an emission spectrum and an excitation spectrum of the phosphor 1. As shown in FIG. 2, the phosphor 1 is a blue phosphor in which the peak wavelength of an emission spectrum S1 is around 450 nm. As shown in an excitation spectrum S2, the blue phosphor according to Example 1 is primarily excited by light in an ultraviolet range of a wavelength of 400 nm or shorter to emit a blue light.

The apatite crystal thus obtained is cut by a slicer into a thickness (c-axis direction) of 6 mm. The shape is formed by polishing the cut surface and the side surface.

A metal reflection coating is then provided on the side surface. More specifically, an ion assisted deposition device is used to stack a combination of oxide dielectric thin films having different refractive indices (e.g., $Ta_2O_5$ (60 nm)/$SiO_2$ (30 nm)) repeatedly to form a film. A silver film (200 nm) is formed on the stack and, further, a protective $SiO_2$ film (50 nm) is formed thereon.

The incidence surface is polished by precision polishing processing to have an arithmetic mean roughness Ra of about 50 nm. Subsequently, an ion assisted deposition device is used to stack a combination of oxide dielectric thin films having different refractive indices to form a film. The multilayer film exhibits an optical performance of a short pass filter having a transmittance of 96% or higher at a wavelength shorter than 420 nm and having a transmittance lower than 1% at a wavelength of 420 nm or longer.

The output surface is polished by precision polishing processing to have an arithmetic mean roughness Ra of about 30 nm. Subsequently, an ion assisted deposition device is used to stack a combination of oxide dielectric thin films having different refractive indices to form a film. The multilayer film has a reflective performance of a reflectance of 90%.

Figure 3:
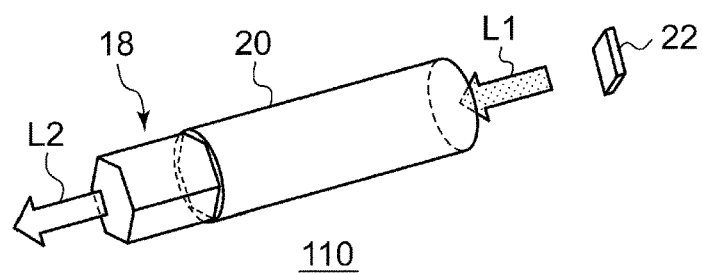
FIG. 3 is a schematic drawing showing a light emitting module including the phosphor rod according to Example 1.

FIG. 3 is a schematic drawing showing a light emitting module including the phosphor rod according to Example 1. The light emitting module 110 is configured by attaching a phosphor rod 18 described above to a tip of an optical fiber 20 having a diameter φ of 200 μm (the diameter of the columnar core is 50 μm, and the thickness of the cylindrical clad surrounding the core is 75 μm) by using a transparent silicone resin. An InGaN-based laser diode 22 configured to emit a light having a peak wavelength of 405 nm is provided at the other end (incidence end) of the optical fiber 20 via a spherical lens or a rod lens for light condensation and introduction, and a violet light is incident on the optical fiber 20. The violet light incident on the monocrystal phosphor rod 18 via the optical fiber 20 is converted inside the phosphor rod 18 into a blue light (λp=460 nm) exhibiting high directionality.

Example 2: A Chlorometasilicate Monocrystal Rod Used in the Phosphor

A description will first be given of a method of manufacturing a monocrystal rod made of chlorometasilicate. Starting materials including $SiO_2$, $CaCO_3$, $SrCl_2 \cdot 2H_2O$, $Eu_2O_3$, and $NH_4Cl$ were weighed such that the molar ratio thereof is $SiO_2:CaCO_3:SrCl_2 \cdot 2H_2O:Eu_2O_3:NH_4Cl=1.0:0.5:0.8:0.2:10.0$. The weighted materials were put into an alumina mortar to grind and mix the materials to obtain a base mixture. The base mixture was put into an alumina crucible and heated to 1000° C. at a rate of temperature increase of 100° C./h. The heated mixture was calcinated (synthesized) in an electrical furnace of a reductive atmosphere for 30 hours at a temperature of 1000° C. and in a predetermined atmosphere ($H_2$:$N_2$=5:95). The temperature was then lowered to 700° C. at a cooling rate 30° C./h. The mixture was then cooled naturally to obtain a calcinated product. The calcinated product thus obtained was carefully cleaned with hot pure water and was filtered. The filtered product was dried for 1 hour at 120° C. to obtain a phosphor 2.

Figure 4:
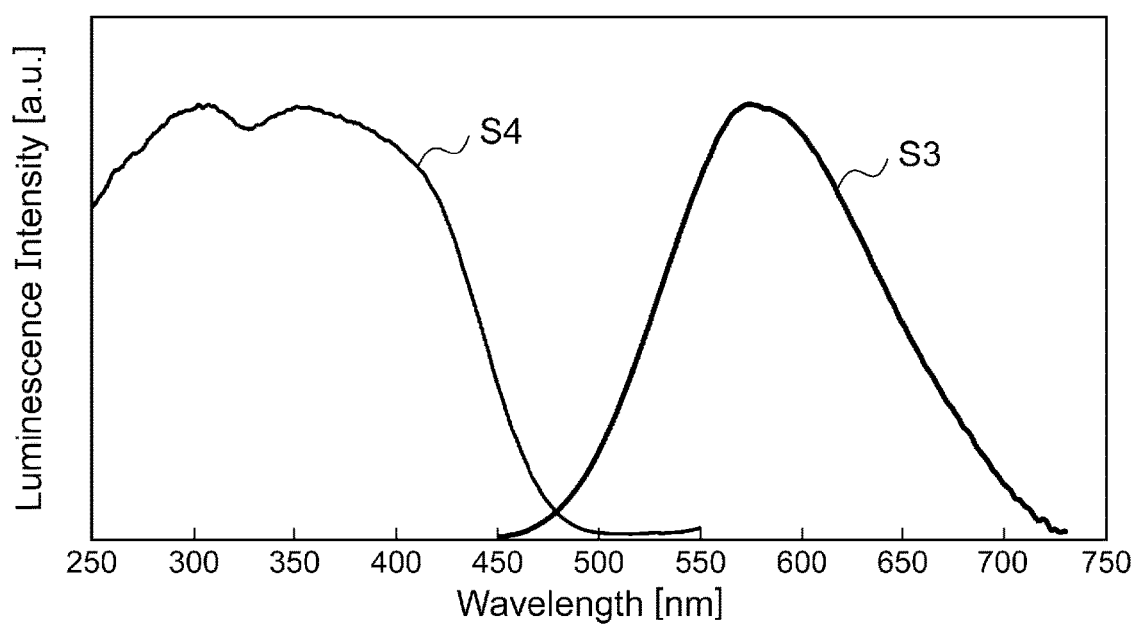
FIG. 4 is a graph showing an emission spectrum and an excitation spectrum of the phosphor 2.

The composition of the phosphor 2 is (Ca,Sr,Eu)$_7$(SiO$_3$)$_6$Cl$_2$. The phosphor is a spherical monocrystal grown to a grain size of 4 mm. FIG. 4 is a graph showing an emission spectrum and an excitation spectrum of the phosphor 2. As shown in FIG. 4, the phosphor 2 is a yellow phosphor in which the peak wavelength of an emission spectrum S3 is around 580 nm. As shown in an excitation spectrum S4, the yellow phosphor according to Example 2 is primarily excited by light in an ultraviolet range of a wavelength of 400 nm or shorter or 410 nm or shorter to emit a yellow light.

The chlorometasilicate monocrystal thus obtained is a monoclinic crystal and was cut under X-ray diffraction observation by a slicer along the light axis direction in which birefringence is not exhibited. The monoclinic crystal thus cut was ground into a shape of a quadratic prism sized 100 μm on a side, and the surface thereof was polished. The polished product was cut again by a slicer to a length of 3 mm and turned into a rod shape.

A metal reflection coating is then provided on the side surface. Specific details are as described in Example 1. The configuration of the incidence surface is similar to that of Example 1.

The output surface is polished by precision polishing processing to have an arithmetic mean roughness Ra of about 30 nm. Subsequently, an ion assisted deposition device is used to stack a combination of oxide dielectric thin films having different refractive indices to form a film. The multilayer film has a reflective performance of a reflectance of 50%.

The configuration of the light emitting module including the phosphor rod according to Example 2 is substantially identical to that of the light emitting module 110 according to Example 1 but differs in that an optical fiber having a diameter φ of 100 μm (the diameter of the columnar core is 25 μm, and the thickness of the cylindrical clad surrounding the core is 37.5 μm) is used. The violet light incident on the monocrystal phosphor rod via the optical fiber is converted inside the phosphor rod into a yellow light (λp=580 nm) exhibiting high directionality.

Example 3: Nanocomposite Phosphor Comprised of SiO$_2$ and (Ca,Eu) I$_2$

A description will be given of a method of manufacturing a rod made of a nanocomposite phosphor in which nano fluorescent components are dispersed. Starting materials including SiO$_2$ fiber, CaI$_2$, Eu$_2$O$_3$, and NH$_4$I were weighed such that the molar ratio thereof is SiO$_2$ fiber:CaI$_2$:Eu$_2$O$_3$:NH$_4$I=1.0:0.1:0.004:0.1. The weighted materials were put into an alumina mortar in a glove box of a dry nitrogen atmosphere to grind and mix the materials to obtain a base mixture. The base mixture was put into an alumina crucible and heated to 1000° C. at a rate of temperature increase of 100° C./h. The heated mixture was calcinated (synthesized) in an electrical furnace of a reductive atmosphere for 15 hours at a temperature of 1000° C. and in a predetermined atmosphere ($H_2$:$N_2$=5:95). The mixture was then cooled naturally to obtain a calcinated product. The calcinated product thus obtained was carefully cleaned with hot pure water and was filtered. The filtered product was dried for 1 hour at 120° C. to obtain a phosphor 3.

Figure 5:
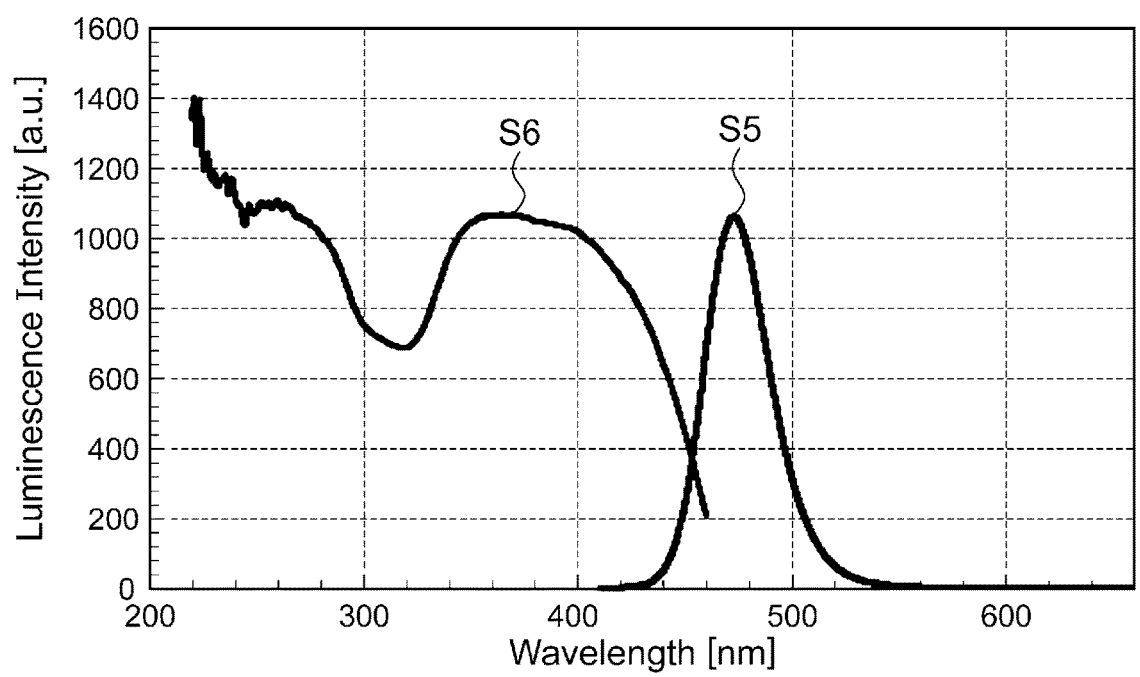
FIG. 5 is a graph showing an emission spectrum and an excitation spectrum of the phosphor 3.

The phosphor 3 is a nanocomposite phosphor in which fluorescent monocrystals (Ca,Eu)I$_2$ having a diameter of about 50 nm and adapted to emit a blue light are dispersed in the SiO$_2$ fiber having a diameter φ of 200 μm and a length of 10 mm. FIG. 5 is a graph showing an emission spectrum and an excitation spectrum of the phosphor 3. As shown in FIG. 5, the phosphor 3 is a blue phosphor in which the peak wavelength of an emission spectrum S5 is around 465 nm. As shown in an excitation spectrum S6, the blue phosphor according to Example 3 is primarily excited by an ultraviolet light or light in a blue light range of a wavelength in a range 320~450 nm to emit a blue light.

The nanocomposite phosphor rod thus obtained is cut by a slicer into a size of 6 mm. The shape is formed by polishing the cut surface.

A metal reflection coating is then provided on the side surface. Specific details are as described in Example 1. The configuration of the incidence surface is similar to that of Example 1. The output surface was polished into a flat surface, and a mask is formed by nanoimprinting. The surface is then dry-etched to produce pyramid-like asperities having a pitch of 100 nm and a height of 50 nm.

The configuration of the light emitting module including the phosphor rod according to Example 3 is substantially identical to that of the light emitting module 110 according to Example 1 but differs in that an optical fiber having a diameter φ of 200 μm (the diameter of the columnar core is 100 μm, and the thickness of the cylindrical clad surrounding the core is 50 μm) is used. The violet light incident on the monocrystal phosphor rod via the optical fiber is converted inside the phosphor rod into a blue light (λp=465 nm) exhibiting high directionality.

Example 4: Use of Nanocomposite Fluorescent Glass Ceramic Rod in which Rare Earth Eu$^{3+}$ is Dispersed in Fluoride Glass A description will be given of a method of manufacturing a rod made of a nanocomposite fluorescent glass ceramic. Starting materials including SiO$_2$, BaF$_2$, AlF$_3$, and EuF$_3$ were weighed such that the molar ratio thereof is SiO$_2$:BaF$_2$:AlF$_3$:EuF$_3$=60:10:10:20. The weighted materials were put into an alumina mortar to grind and mix the materials to obtain a base mixture. The base mixture was put into an alumina crucible and heated to 1300° C. at a rate of temperature increase of 100° C./h. The heated mixture was calcinated (synthesized) in an electrical furnace of a nitrogen atmosphere for 5 hours. The mixture was then cooled naturally to obtain molten glass.

Figure 6:
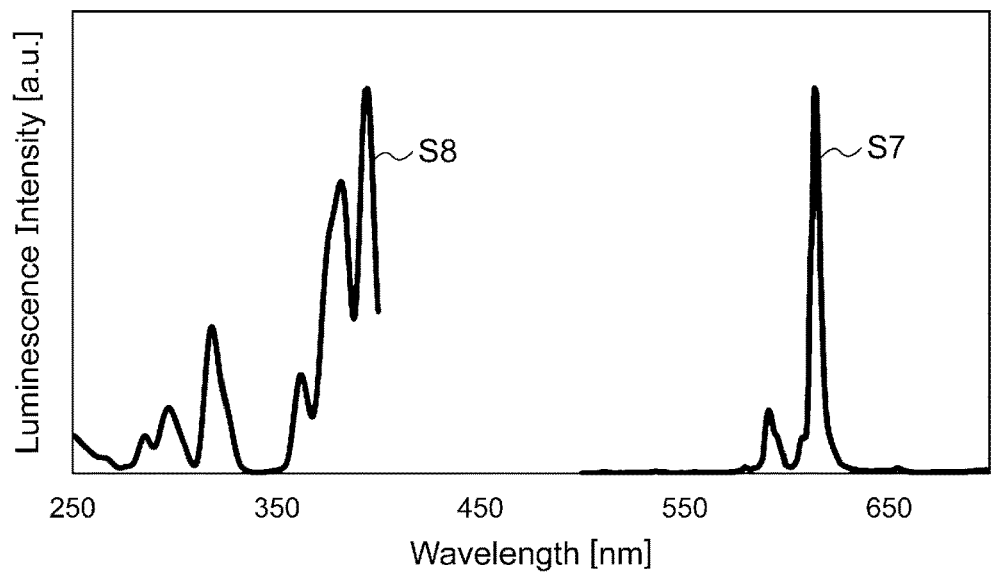
FIG. 6 is a graph showing an emission spectrum and an excitation spectrum of the nanocomposite fluorescent glass ceramic.

By annealing the glass thus obtained at 600° C. (higher than the glass transition temperature), microcrystals originating from the rare earth and observed to exhibit a diffraction peak under X-ray diffraction observation are produced in the glass. Thus, a nanocomposite fluorescent glass ceramic is obtained. FIG. 6 is a graph showing an emission spectrum and an excitation spectrum of the nanocomposite fluorescent glass ceramic. As shown in FIG. 6, the nanocomposite fluorescent glass ceramic is a red phosphor in which the peak wavelength of an emission spectrum S7 is around 614 nm. As shown in an excitation spectrum S8, the red phosphor according to Example 4 is primarily excited by light in an ultraviolet range of a wavelength of shorter than 400 nm to emit a red light.

The nanocomposite fluorescent glass ceramic thus obtained is cut by a slicer into a size of 6 mm. The shape is formed by polishing the cut surface.

A metal reflection coating is then provided on the side surface. Specific details are as described in Example 3. The configuration of the incidence surface and the output surface is similar to that of Example 3.

Four nanocomposite fluorescent glass ceramic rods manufactured as described above were prepared and arranged and disposed on the light emitting surface of an LED (the emission peak wavelength λp=395 nm) of a flip chip type having a size of 500 μm on a side such that the longitudinal direction of each rod is aligned with the direction of radiation of device light. The assembly was packaged by sealing it with a silicone resin. The violet light emitted by the LED chip and incident on the nanocomposite fluorescent glass ceramic rod is converted inside the phosphor rod into a red light (λp=614 nm) exhibiting high directionality.

Example 5: Use of a $Y_3Al_5O_{12}$:Ce Translucent Ceramic

A description will be given of a method of manufacturing a translucent ceramic. An aqueous solution in which $Y_2O_3$, $CeO_2$ are dissolved by nitric acid and an aqueous solution in which $Al_2(NO_3)_3$ is dissolved by pure water were prepared. The solutions were adjusted for the density and were mixed in a stoichiometric proportion. The mixture is adjusted to pH7~9 by ammonium hydrogen carbonate, which is allowed to precipitate as carbonate, so as to obtain mixed base powder.

The mixed base powder was put into an alumina crucible and calcinated for 3 hours at a temperature of 1200° C. to obtain fine powder having a composition $Y_{2.995}Al_5O_{12}$:$Ce_{0.005}$. A 3~15 weight percent slurry was prepared by using the fine powder. Subsequently, a tablet was molded by cast molding. After the molded table is dried, the tablet was preliminarily sintered by being heated at 1500° C. for 10 hours. The density of the preliminarily sintered product was increased by hot isostatic pressing (HIP) under the condition of 2000° C. and 2000 times the atmospheric pressure to obtain a translucent ceramic.

Figure 7:
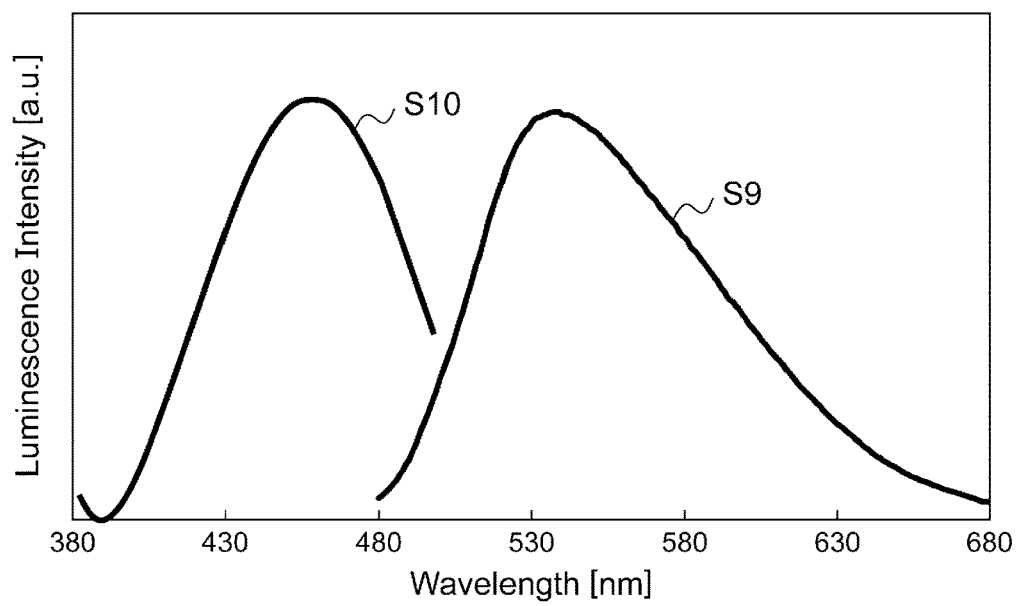
FIG. 7 is a graph showing an emission spectrum and an excitation spectrum of the translucent ceramic.

FIG. 7 is a graph showing an emission spectrum and an excitation spectrum of the translucent ceramic; As shown in FIG. 7, the translucent ceramic is a yellow phosphor in which the peak wavelength of an emission spectrum S9 is around 540 nm. As shown in an excitation spectrum S10, the yellow phosphor according to Example 5 is primarily excited by light in a blue light range of a wavelength in a range 430~480 nm to emit a yellow light.

The translucent ceramic phosphor thus obtained was cut by a slicer into a thickness of 200 μm. The cut surface was polished, and the phosphor was further cut into a width of 200 μm and a length of 3 mm. The shape is formed by polishing the cut surface.

A metal reflection coating is then provided on the side surface. More specifically, an ion assisted deposition device is used to stack a combination of oxide dielectric thin films having different refractive indices (e.g., $Ta_2O_5$ (60 nm)/$SiO_2$ (30 nm)) repeatedly to form a film. A silver film (200 nm) is formed on the stack.

The incidence surface is polished by precision polishing processing to have an arithmetic mean roughness Ra of about 50 nm. Subsequently, an ion assisted deposition device is used to stack a combination of oxide dielectric thin films having different refractive indices to form a film. The multilayer film exhibits an optical performance of a short pass filter having a transmittance of 96% or higher at a wavelength shorter than 480 nm and having a transmittance lower than 1% at a wavelength of 480 nm or longer.

The output surface is polished by precision polishing processing to have an arithmetic mean roughness Ra of about 30 nm. Subsequently, an ion assisted deposition device is used to stack a combination of oxide dielectric thin films having different refractive indices to form a film. The multilayer film has a reflective performance of a reflectance of 95%.

The light emitting module is configured by attaching the phosphor rod described above to a tip of an optical fiber having a diameter φ of 200 μm (the diameter of the columnar core is 50 μm, and the thickness of the cylindrical clad surrounding the core is 75 μm) by using a transparent silicone resin. An InGaN-based laser diode configured to emit a light having a peak wavelength of 455 nm is provided at the other end (incidence end) of the optical fiber via a spherical lens or a rod lens for light condensation and introduction, and a blue light is incident on the optical fiber 20. The blue light incident on the monocrystal phosphor rod via the optical fiber is converted inside the phosphor rod into a yellow light (λp=540 nm). A highly directional white light is obtained by a mixture of the blue light and the yellow light.

Comparative Example 1: Non-Transparent Matrix

A description will first be given of a method of manufacturing a sintered rod made of a chlorometasilicate phosphor. Starting materials including $SrCO_3$, $SiO_2$, $CaCO_3$, $SrCl_2.2H_2O$, and $Eu_2O_3$ were weighed such that the molar ratio thereof is $SrCO_3$:$SiO_2$:$CaCO_3$:$SrCl_2.2H_2O$:$Eu_2O_3$=0.3:1.0:0.7:1.0:0.01. The weighted materials were put into an alumina mortar to grind and mix the materials to obtain a base mixture. The base mixture was put into an alumina crucible and heated to 1000° C. at a rate of temperature increase of 100° C./h. The heated mixture was calcinated (synthesized) in an electrical furnace of a reductive atmosphere for 3 hours at a temperature of 1000° C. and in a predetermined atmosphere ($H_2$:$N_2$=5:95). The mixture was then cooled naturally to obtain a calcinated product. The calcinated product thus obtained was carefully cleaned with hot pure water and was filtered. The filtered product was dried for 1 hour at 120° C. to obtain a synthesized product.

The composition of the synthesized product is $(Ca,Sr,Eu)_7(SiO_3)_6Cl_2$. The synthesized product includes fine particles having a grain size of 0.5 μm. A sintered product of chlorometasilicate phosphor was obtained by cast molding the fine particles thus obtained and heating and sintering the cast molded product for 100 hours at 900° C. and in a reductive atmosphere ($H_2$:$N_2$=5.95). The sintered product was cut by a slicer and ground into a shape of a quadratic prism sized 100 μm on a side, and the surface thereof was polished. The polished product was cut again by a slicer to a length of 3 mm and turned into a rod shape. The linear transmittance of the resultant rod is 8%, which is low.

A metal reflection coating is then provided on the side surface. Specific details are as described in Example 1. The configuration of the incidence surface is similar to that of Example 1.

The output surface is polished by precision polishing processing to have an arithmetic mean roughness Ra of about 30 nm. Subsequently, an ion assisted deposition device is used to stack a combination of oxide dielectric thin films having different refractive indices to form a film. The multilayer film has a reflective performance of a reflectance of 50%.

The configuration of the light emitting module including the phosphor rod according to the comparative example 1 is substantially identical to that of the light emitting module according to Example 1 but differs in that an optical fiber having a diameter φ of 100 μm (the diameter of the columnar core is 25 μm, and the thickness of the cylindrical clad surrounding the core is 37.5 μm) is used. The violet light incident on the phosphor rod of the sintered product via the optical fiber is converted inside the phosphor rod into a yellow light ($\lambda p$=580 nm) that does not exhibit much directionality.

Comparative Example 2: Chlorometasilicate Monocrystal not Having a Rod Structure Used in the Phosphor The chlorometasilicate monocrystal according to comparative example 2 was obtained by a method similar to that of Example 2. The monoclinic chlorometasilicate monocrystal thus obtained was worked into a cubic form sized 310 μm on a side by using a slicer, a grinder, and a polisher. This results in substantially the same volume as that of the phosphor monocrystal rod of Example 2.

The side surface, the incidence surface, and the output surface were treated in a manner similar to that of Example 2. Further, the monocrystal phosphor was provided at a tip of the optical fiber by a method similar to that of Example 2 to form a light emitting module.

Comparative Example 3: The Rod Surface not Coated with a Reflection Coating

The phosphor according to comparative example 3 was manufactured by working an apatite phosphor monocrystal rod similar to that of Example 1 into the same shape as that of Example 1. However, the phosphor rod according to comparative example 3 differs from that of Example 1 in that the surface is not treated at all. The phosphor is used to build a light emitting module with a configuration similar to that of Example 1.

(Performance Assessment)

The output angles of light emitted from the output surface of the light emitting modules according to the examples and the comparative examples were measured. Table 1 shows solid output angles of emitted light and emitted colors in the phosphors according to the examples and the comparative examples.

TABLE 1

|  | Solid output angle of emitted light (Sr) | Emitted color |
| --- | --- | --- |
| Example 1 | 1.01 | Blue |
| Example 2 | 1.14 | Yellow |
| Example 3 | 1.20 | Blue |
| Example 4 | 0.74 | Red |
| Example 5 | 0.84 | White (uniform color) |

TABLE 1-continued

|  | Solid output angle of emitted light (Sr) | Emitted color |
| --- | --- | --- |
| Comparative example 1 | 11.43 | Yellow |
| Comparative example 2 | 12.43 | Yellow |
| Comparative example 3 | 12.35 | Blue |

As shown in Table 1, the solid output angles of emitted light in the phosphors according to the examples are less than 1.47 sr (semi-apex angle=40°), revealing that the output light emitted from the phosphors is highly directional. Meanwhile, the solid output angles of emitted light in the phosphors according to the comparative examples are 11.10 sr (semi-apex angle=140°) or greater, revealing that the output light emitted from the phosphors is hardly directional.

Figure 8:
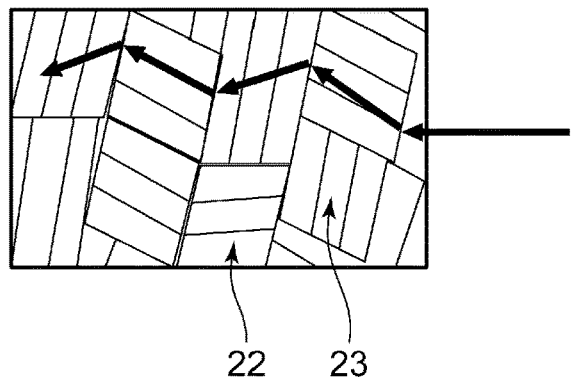
FIG. 8 is a schematic diagram showing how the travels inside the phosphor rod according to comparative example 1.

FIG. 8 is a schematic diagram showing how the light travels inside the phosphor rod according to comparative example 1. The chlorometasilicate phosphor according to comparative example 1 is a monoclinic crystal so that the refractive index varies depending on the crystal orientation. In a polycrystal sintered product in which the orientations of crystallites 23 are not aligned, therefore, the light cannot travel straight due to the variation in the refractive index at crystal grain boundaries, which makes it difficult to improve the directionality.

(Absorption of Excitation Light)

In a monocrystal in which the light is not scattered at the grain boundary, the transmittance of excitation light is high and the ratio of absorption of excitation light is significantly low. This is addressed by the light emitting modules according to the embodiment by selecting the rod shape and the configuration of the reflection coating in the wavelength converter as appropriate, thereby increasing the ratio of absorption of excitation light as well as increasing the directionality of output light.

Figure 9:
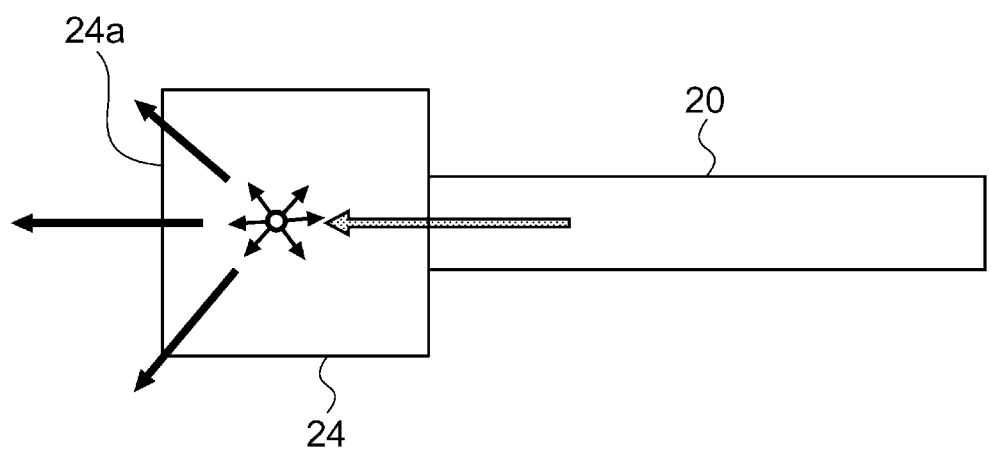
FIG. 9 is a schematic diagram showing a wavelength-converted light inside the phosphor according to comparative example 2.

The rod shape improves the directionality of excitation light, ensuring that the excitation light reciprocates repeatedly in the longitudinal direction of the rod and is absorbed. FIG. 9 is a schematic diagram showing a wavelength-converted light inside the phosphor according to comparative example 2. If a phosphor 24 is cubic as in comparative example 2, the orientations of the wavelength-converted light are not aligned, and the critical angle of light impinging a surface 24a of the phosphor 24 is increased. Therefore, the light is not sufficiently contained inside the phosphor so that the efficiency is lowered.

Figure 10:
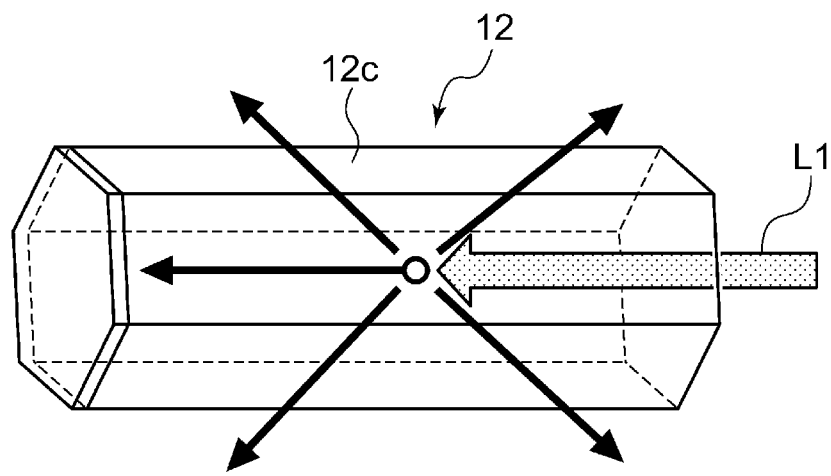
FIG. 10 is a schematic diagram showing the wavelength-converted light inside the phosphor according to comparative example 3.

The reflection coating on the surface carries weight to contain the excitation light inside the phosphor and secure the ratio of absorption. FIG. 10 is a schematic diagram showing the wavelength-converted light inside the phosphor according to comparative example 3. As shown in FIG. 10, a portion of the light subjected to wavelength conversion is transmitted through the side surface 12c and leaves the phosphor. Therefore, the efficiency of using the excitation light is significantly reduced.

Table 2 shows the phosphor composition, the phosphor shape, whether the reflection coating is provided, and the ratio of absorption of excitation light in Example 1, Example, 2, comparative example 2, and comparative example 3.

TABLE 2

| | Phosphor composition | Phosphor shape | Reflection coating | Ratio of absorption of excitation light |
|---|---|---|---|---|
| Example 1 | Ca$_5$(PO$_4$)$_3$Cl:Eu$^{2+}$ | Rod (φ200 μm · 6 mm) | Yes | 100% |
| Comparative Example 3 | ↑ | ↑ | No | 12% |
| Example 2 | (Ca, Sr, Eu)$_7$(SiO$_3$)$_6$Cl$_2$ | Rod (φ100 μm · 3 mm) | Yes | 100% |
| Comparative Example 2 | ↑ | Cubic (0.31 mm on a side) | Yes | 34% |

Second Embodiment

Figure 11:
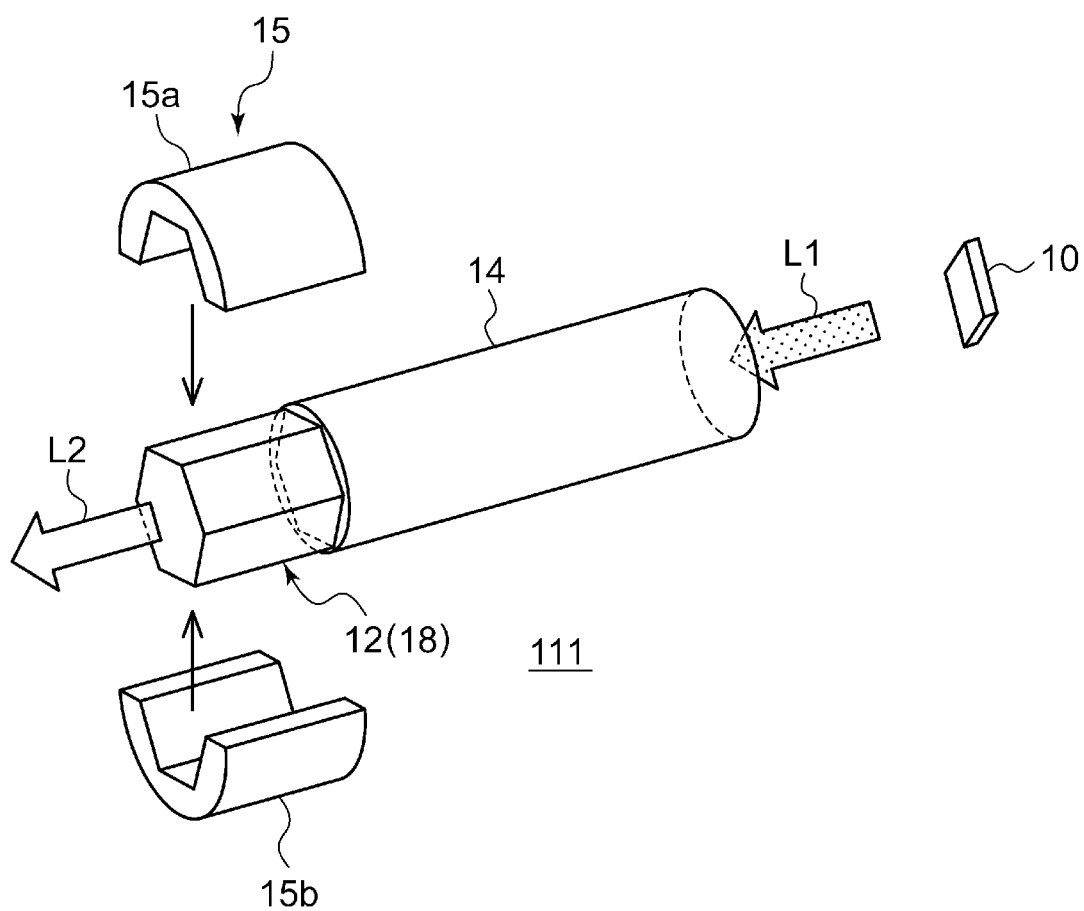
FIG. 11 is a schematic drawing showing a light emitting module according to the second embodiment.

FIG. 11 is a schematic drawing showing a light emitting module according to the second embodiment. A light emitting module 111 includes a light emitting device 10 as a light source, a wavelength converter 12 (see FIG. 1), an optical fiber 14, and a heat sink 15 as a heat dissipation part. The light emitting module 111 also includes a columnar phosphor rod 18 embodying the wavelength converter 12. The detail of the material of the phosphor rod 18 will be described later.

The phosphor rod 18 is attached to a tip of an optical fiber 14 having a diameter φ of 200 μm (the diameter of the columnar core is 50 μm, and the thickness of the cylindrical clad surrounding the core is 75 μm) by using a transparent silicone resin. The light emitting device 10 is provided near the other end (incidence end) of the optical fiber 14 via a spherical lens or a rod lens for light condensation and introduction. This causes the light emitting device 10 embodying a heat generator and the wavelength converter 12 to be spaced apart from each other via the optical fiber 14 so that the heat dissipation performance is improved. The light emitted from the light emitting device 10 may be directed collected on the incidence part 12a of the phosphor rod 18 via a collimating lens without using the optical fiber. By providing a distance from a heat source, the light emitting module as a whole can be efficiently cooled to dissipate the heat.

An InGaN-based laser diode, a type of wide bandgap semiconductor, configured to emit a light having a peak wavelength of 405 nm is used for the light emitting device 10 according to the second embodiment. A violet light is incident on the optical fiber 14. The violet light incident on the monocrystal phosphor rod 18 via the optical fiber 14 is converted inside the phosphor rod 18 into a blue light (λp=460 nm) exhibiting high directionality. This reduces the proportion of the light emitted from the side surface of the wavelength converter 12. Therefore, the amount of light shielded by the heat sink 15 is reduced, and the proportion of the light contributing to the light distribution by the light emitting module 111 is increased.

The heat sink 15 is provided to cover at least a portion of the wavelength converter 12. The heat sink 15 according to the second embodiment is split into two semicylindrical members 15a and 15b and is made of a material having a high thermal conductivity. A material having a high thermal conductivity is exemplified by carbon, copper, gold, silver, aluminum, magnesium, zinc, brass, silicon carbide (SiC), boron nitride (BN), and aluminum nitride (AlN). The inner circumference of each of the members 15a and 15b is shaped to conform to the shape of the outer circumference of the wavelength converter 12. The members 15a and 15b are joined to sandwich the wavelength converter 12 to form the heat sink 15. A material having a thermal conductivity of 50 [W/(m·K)] or higher may be used for the heat sink 15. This improves the heat dissipation performance of the heat sink 15.

The wavelength converter 12 according to the second embodiment is comprised of a material whereby the degree of scattering of the light L1 of the light emitting device incident via the incidence part 12a and traveling toward the output part 12b is smaller than in the case of a polycrystalline material. Also, the wavelength converter 12 is comprised of a material whereby the degree of scattering of the light of the light emitting device 10 incident via the incidence part 12a and traveling toward the output part 12b is smaller than the degree of the light of the light emitting device 10 incident via the incidence part 12a and traveling toward the side surface 12c. The feature increases the proportion of the light traveling from the incidence part 12a toward the output part 12b and enhances the directionality of the light emitted from the output part 12b. In further accordance with the embodiment, the light that would have leaked outside from a portion of the surface in the related art is internally reflected by the reflecting part 16 and is output from the output part 12b so that the efficiency of using the light is improved.

Thus, the proportion of the light emitted from the side surface 12c of the wavelength converter 12 is reduced so that the amount of light shielded by the heat sink 15 is reduced and the proportion of the light contributing to the light distribution by the light emitting module 111 is increased accordingly.

The reflection coating 16a according to the second embodiment is provided between the side surface 12c and the heat sink 15 and is configured to internally reflect the light of the light emitting device 10 incident on the wavelength converter 12. A material having a visible light reflectance of 80% or higher is used for the reflection coating 16a. A material having a high visible light reflectance is exemplified by a metal such as aluminum and silver, a stack of dielectric films having different refractive indices, or a stack of metal and dielectric films. This ensures that the light that would have leaked outside from a portion of the side surface 12c in the related art is internally reflected by the reflection coating 16a and is output from the output part 12b so that the efficiency of using the light is improved.

Figure 12:
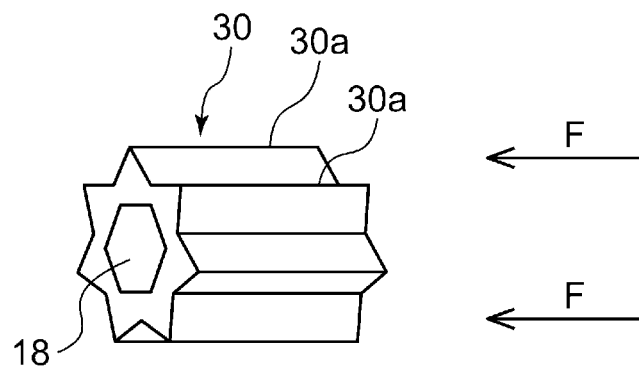
FIG. 12 is a schematic diagram of a heat dissipation part according to a variation of the second embodiment.

FIG. 12 is a schematic diagram of a heat dissipation part according to a variation of the second embodiment. The heat dissipation part 30 shown in FIG. 12 is a tubular member and houses the phosphor rod 18 in the interior space. A plurality of fins 30a are formed on the outer circumference of the heat dissipation part 30 in the axial direction of the phosphor rod 18. By blowing air in a direction indicated by an arrow F along the longitudinal direction of the fins 30a, the phosphor rod 18 is cooled efficiently.

Figure 13:
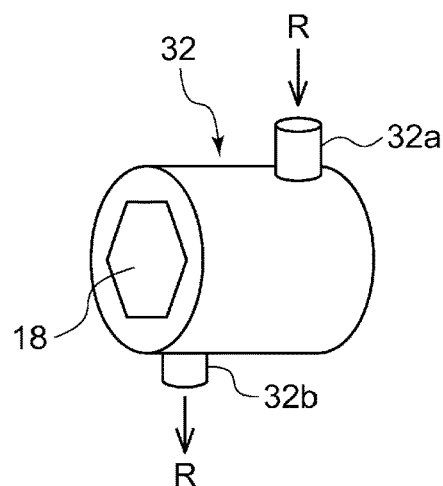
FIG. 13 is a schematic diagram of a heat dissipation part according to another variation of the second embodiment.

FIG. 13 is a schematic diagram of a heat dissipation part according to another variation of the second embodiment.

The heat dissipation part 32 shown in FIG. 13 is a cylindrical member and houses the phosphor rod 18 in the interior space. An inflow port 32a through which a coolant circulating inside the heat dissipation part 32 flows in and an outflow port 32b through which the coolant flows out are provided on the outer circumference of the heat dissipation part 32. The feature cools the phosphor rod 18 efficiently.

Third Embodiment

A description will now be given of a fluorescent member and a light emitting module according to the third embodiment with reference to Examples 6~13.

Example 6

[Fluorescent Member]

Figure 14:
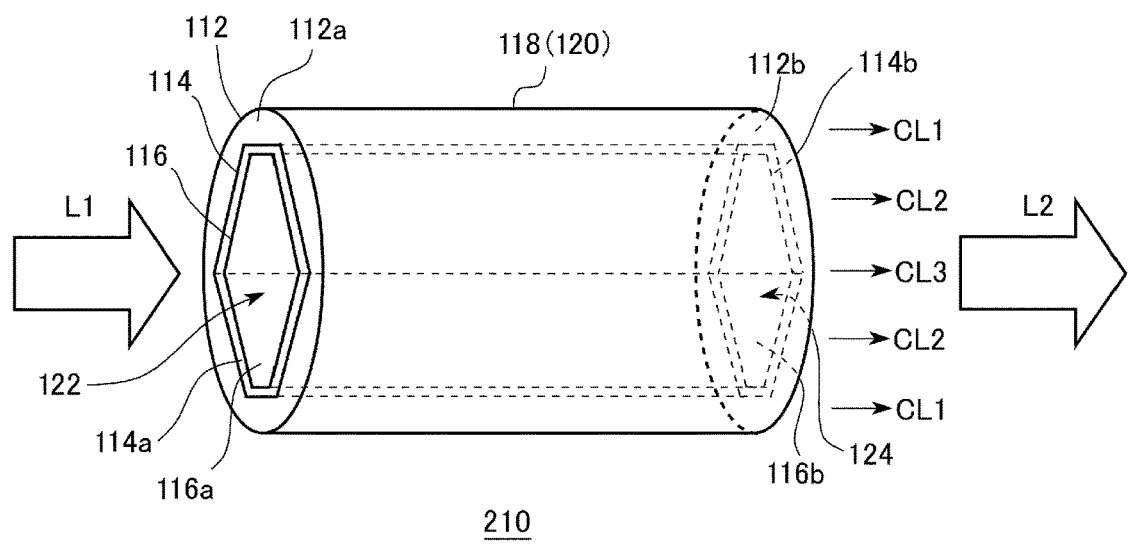
FIG. 14 is a schematic diagram of a fluorescent member according to Example 6.

FIG. 14 is a schematic diagram of a fluorescent member according to Example 6. As shown in FIG. 14, a fluorescent member 210 includes a tubular first wavelength converter 112, a tubular second wavelength converter 114 having a smaller outer diameter than the outer diameter of the first wavelength converter 112, and a columnar third wavelength converter 116 having a smaller outer diameter than the outer diameter of the second wavelength converter 114. In other words, the second wavelength converter 114 is provided inside hole of the first wavelength converter 112, and the third wavelength converter 116 is provided inside the hole of the second wavelength converter 114. The feature realizes a compact fluorescent member provided with a plurality of types of wavelength converters.

The first wavelength converter 112 includes an annular first incidence part 112a on which the light L1 of the light source is incident and an annular first output part 112b from which a converted light CL1 of a first color subjected to wavelength conversion as a result of the excitation by the incident light is output. The second wavelength converter 114 includes a second incidence part 114a on which the light L1 of the light source is incident and a second output part 114b from which a converted light CL2 of a second color subjected to wavelength conversion as a result of the excitation by the incident light is output. The third wavelength converter 116 includes a third incidence part 116a on which the light L1 of the light source is incident and a third output part 116b from which a converted light CL3 of a third color subjected to wavelength conversion as a result of the excitation by the incident light is output.

Further, as shown in FIG. 14, the first incidence part 112a, the second incidence part 114a, and the third incidence part 116a are adjacent to each other and are provided to face the light emitting surface of the light source.

The first wavelength converter 112 is comprised of a material whereby the degree of scattering of the light of the light source incident via the first incidence part 112a and traveling toward the first output part 112b is smaller than in the case of a polycrystalline material. The second wavelength converter 114 is comprised of a material whereby the degree of scattering of the light of the light source incident via the second incidence part 114a and traveling toward the second output part 114b is smaller than in the case of a polycrystalline material. The third wavelength converter 116 is comprised of a material whereby the degree of scattering of the light of the light source incident via the third incidence part 116a and traveling toward the third output part 116b is smaller than in the case of a polycrystalline material.

In the fluorescent member 210, the first wavelength converter 112 is comprised of a material whereby the degree of scattering of the light of the light source incident via the first incidence part 112a and traveling toward the first output part 112b is smaller than in the case of a polycrystalline material. Therefore, the proportion of the light traveling from the first incidence part 112a toward the first output part 112b is increased, and the directionality of the converted light CL1 of the first color output from the first output part 112b is enhanced. Further, the second wavelength converter 114 is comprised of a material whereby the degree of scattering of the light of the light source incident via the second incidence part 114a and traveling toward the second output part 114b is smaller than in the case of a polycrystalline material. Therefore, the proportion of the light traveling from the second incidence part 114a toward the second output part 114b is increased, and the directionality of the converted light CL2 of the second color output from the second output part 114b is enhanced. Further, the third wavelength converter 116 is comprised of a material whereby the degree of scattering of the light of the light source incident via the third incidence part 116a and traveling toward the third output part 116b is smaller than in the case of a polycrystalline material. Therefore, the proportion of the light traveling from the third incidence part 116a toward the third output part 116b is increased, and the directionality of the converted light CL3 of the third color output from the third output part 116b is enhanced.

By mixing the converted light CL1 of the first color, the converted light CL2 of the second color different from the first color, and the converted light CL3 of the third color, emission of highly directional light L2 of any of a variety of colors not realized by a single color is enabled. The converted light CL3 of the third color may have the same color as the converted light CL1 of the first color or the converted light CL2 of the second color or may have a color different from CL1 or CL2.

In the fluorescent member 210 according to Example 6, the first wavelength converter 112 is a rod-shaped member. The first incidence part 112a is formed at one end of the member in the longitudinal direction, and the first output part 112b is formed at the other end of the member in the longitudinal direction. Further, the second wavelength converter 114 is a rod-shaped member. The second incidence part 114a is formed at one end of the member in the longitudinal direction, and the second output part 114b is formed at the other end of the member in the longitudinal direction. Further, the third wavelength converter 116 is a rod-shaped member. The third incidence part 116a is formed at one end of the member in the longitudinal direction, and the third output part 116b is formed at the other end of the member in the longitudinal direction. The feature aligns the directions of the light incident via the respective incidence parts as it passes through the respective rod-shaped members, enhancing the directionality of the light emitted from the respective output parts.

The aspect ratio of the first wavelength converter 112 is preferably 10 or higher. The aspect ratio of the second wavelength converter 114 is preferably 10 or higher. The aspect ratio of the third wavelength converter 116 is preferably 10 or higher. The feature realizes a fluorescent member elongated and exhibiting high directionality.

As mentioned above, a polycrystalline phosphor includes a collection of very small monocrystals (crystallites) sized about several tens of nanometers (nm), and an interface called crystal grain boundary is found between crystallites. Therefore, the light is heavily scattered and shielded at the interface. To address this, the wavelength converter according to Example 6 is comprised of a material whereby the degree of scattering of the light of the light emitting device incident via the incidence part and traveling toward the output part is smaller than in the case of a polycrystalline material. The degree of scattering can be defined as a proportion of the light of the light emitting device incident via the incidence part that is refracted or reflected. The smaller the proportion, the smaller the degree of scattering. Alternatively, the degree may be determined by knowing how much the direction of the light of the light emitting device incident via the incidence part and traveling toward the output part is changed as the light is scattered. For example, the degree of scattering will be smaller in the case the traveling direction of light is changed only by 10° than in the case the traveling direction of light is changed by 30° as the light is scattered.

When the wavelength converter is made of a monocrystal material or a ceramic material, the angle formed by the principal axis of the monocrystal material or the ceramic material and the straight line connecting the incidence part and the output part may preferably be within ±5°, and, more preferably, ±3°. The straight line connecting the incidence part and the output part may be defined, for example, as a straight line intersecting the incidence part and the output part that has the shortest length. Alternatively, the straight line may be defined as a normal to at least one of the incidence part and the output part that intersects the other surface. The principal axis is a direction in an optically anisotropic birefringent crystal in which incident light does not diverge and can be translated into a light axis. A uniaxial crystal belongs to a hexagonal system or a diametric system, and a biaxial crystal belongs to an orthorhombic system, a monoclinic system, or a triclinic system. An isotropic crystal (e.g., a crystal of a cubic system) does not have a principal axis. The above feature ensures that the more parallel the light is to the principal axis, the easier it is for the light to reach the output part and so further enhances the directionality of the light emitted from the output part.

A description will now be given of the composition and the method of manufacturing of the wavelength converters in the fluorescent member 210 according to Example 6. In the fluorescent member 210 according to Example 6, a chloroapatite monocrystal phosphor is used as the second wavelength converter 114, and a chlorometasilicate monocrystal phosphor is used as the first wavelength converter 112 and the third wavelength converter 116.

[Manufacturing of Rod]

A description will now be given of a method of manufacturing the second wavelength converter 114. Starting materials including $CaHPO_4.2H_2O$, $CaCO_3$, $CaCl_2$, and $Eu_2O_3$ were weighed such that the molar ratio thereof is $CaHPO_4.2H_2O:CaCO_3:CaCl_2:Eu_2O_3=3.0:1.5:0.5:0.1$. The weighted materials were put into an alumina mortar to grind and mix the materials. Thereafter, NaCl was added and mixed so that the chlorapatite concentration is 0.15 mol %.

The base mixture was put into an alumina crucible and heated to 1200° C. at a rate of temperature increase of 100° C./h. The heated mixture was calcinated (synthesized) in an electrical furnace of a reductive atmosphere for 12 hours at a temperature of 1200° C. and in a predetermined atmosphere ($H_2:N_2=5:95$). The temperature was then lowered to 800° C. at a cooling rate 300° C./h. The mixture was then cooled naturally to obtain a calcinated product. The calcinated product thus obtained was carefully cleaned with hot pure water and was filtered. The filtered product was dried for 1 hour at 120° C. to obtain a monocrystal phosphor.

Figure 15:
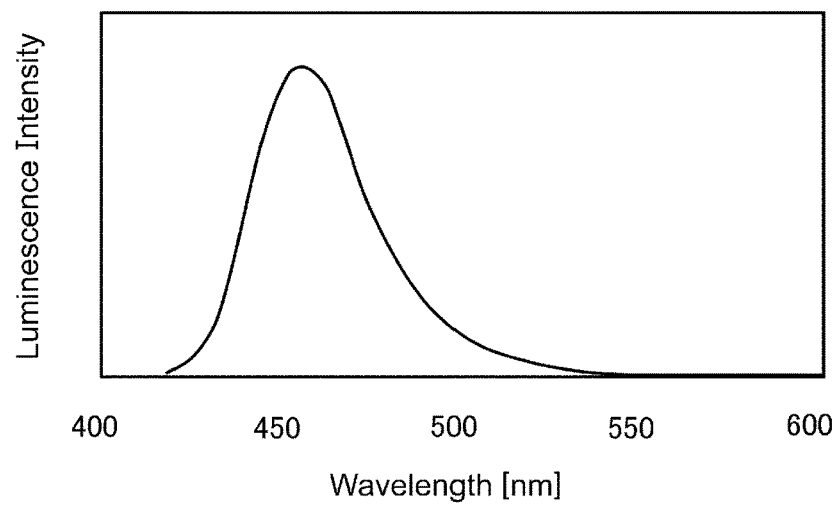
FIG. 15 shows an emission spectrum of the chloroapatite monocrystal phosphor according to Example 6.

The composition of the monocrystal phosphor is $Ca_5(PO_4)_3Cl:Eu^{2+}$. A tubular hexagonal prism chloroapatite monocrystal phosphor hollow at the center (hereinafter, may be referred to as "tubular phosphor") having an outer diameter φ of 200 μm, an inner diameter φ of 100 μm, and a length of 50 mm, and grown in the direction of the c-axis was obtained. FIG. 15 shows an emission spectrum of the chloroapatite monocrystal phosphor according to Example 6. As shown in FIG. 15, the chloroapatite monocrystal phosphor according to Example 6 is a phosphor that emits a blue light by being excited by an excitation light having a wavelength of 405 nm.

An $SiO_2$ film is formed on the surface of the tubular phosphor. More specifically, a carrier gas produced by mixing oxygen with an organic silicon compound represented by tetramethoxysilan (TEOS; $Si(OCH_3)_4$) was used in a plasma CVD device, and an $SiO_2$ film was formed on the tubular phosphor heated to 350° C. in a thickness of 0.2 μm.

Further, a chlorometasilicate monocrystal phosphor is formed on the inner side surface and the outer side surface of the tubular phosphor coated with $SiO_2$. The chlorometasilicate monocrystal phosphors thus formed represent the first wavelength converter 112 and the third wavelength converter 116. The chlorometasilicate monocrystal phosphor is a phosphor that emits a broad yellow light having a peak at the wavelength 580 nm by being excited by an excitation light having a wavelength of 405 nm.

To manufacture a chlorometasilicate monocrystal phosphor, starting materials including $SiO_2$, $CaCO_3$, $SrCl_2.2H_2O$, $Eu_2O_3$, and $NH_4Cl$ were weighed such that the molar ratio thereof is $SiO_2:CaCO_3:SrCl_2.2H_2O:Eu_2O_3:NH_4Cl=1.0:0.5:0.8:0.2:5.0$. The base mixture and the tubular phosphor coated with $SiO_2$ are weighed in equal amounts and mixed lightly in a mortar. The mixture is then mixed by dry air.

The base mixture was put into an alumina crucible and heated to 850° C. at a rate of temperature increase of 100° C./h. The heated mixture was calcinated (synthesized) in an electrical furnace of a reductive atmosphere for 40 hours at a temperature of 850° C. and in a predetermined atmosphere ($H_2:N_2=5:95$). The temperature was then lowered to 700° C. at a cooling rate 300° C./h. The mixture was then cooled naturally to obtain a calcinated product. The calcinated product thus obtained was carefully cleaned with hot pure water and was filtered. The filtered product was dried for 1 hour at 120° C.

In this way, a rod-shaped composite body having a diameter φ of 250 μm and a length of 50 mm in which the tubular phosphor coated with $SiO_2$ is wrapped by the chlorometasilicate monocrystal phosphors was obtained. The rod-shaped composite body is a phosphor that emits a white light by being excited by an excitation light having a wavelength of 405 nm.

[Shaping]

The rod-shaped composite body thus obtained was cut by a slicer into a length of 40 mm. The rod shape was formed by polishing the cut surface and the side surface.

[Side Surface Reflection Coating]

An ion assisted deposition device was used to alternately form oxide dielectric thin films having different refractive indices ($Ta_2O_5$ (60 nm)/$SiO_2$ (30 nm)) on a side surface 118 of the fluorescent member 210, thereby forming a stack of layers. Subsequently, a silver film (200 nm) is formed on the stack of layers, and an $SiO_2$ film (50 nm) is further formed thereon as a protective film to embody a side surface reflection coating 120. The features ensure that the light that would have leaked outside from a portion of the surface in the related art is internally reflected by the side surface reflection coating 120 and is output from the output surface so that the efficiency of using the light is improved.

[Incidence Surface]

An incidence surface 122 of the fluorescent member 210 is polished by precision polishing processing to have a surface roughness (arithmetic mean roughness Ra) of about 50 nm (50 nm±10 nm). Subsequently, an ion assisted deposition device was used to alternately form oxide dielectric thin films having different refractive indices on the incidence surface 122, thereby forming a stack of layers. The stack of layers exhibits an optical performance of a short pass filter. The stack of layers has a transmittance of 96% or higher at a wavelength shorter than 420 nm and a transmittance lower than 1% at a wavelength of 420 nm or longer.

[Output Surface]

An output surface 124 of the fluorescent member 210 is polished by precision polishing processing to have a surface roughness (arithmetic mean roughness Ra) of about 30 nm (30 nm±10 nm). Subsequently, an ion assisted deposition device was used to alternately form oxide dielectric thin films having different refractive indices on the output surface 124, thereby forming a stack of layers. The stack of layers has a reflective performance of a reflectance of 90%.

[Light Emitting Module]

Figure 16:
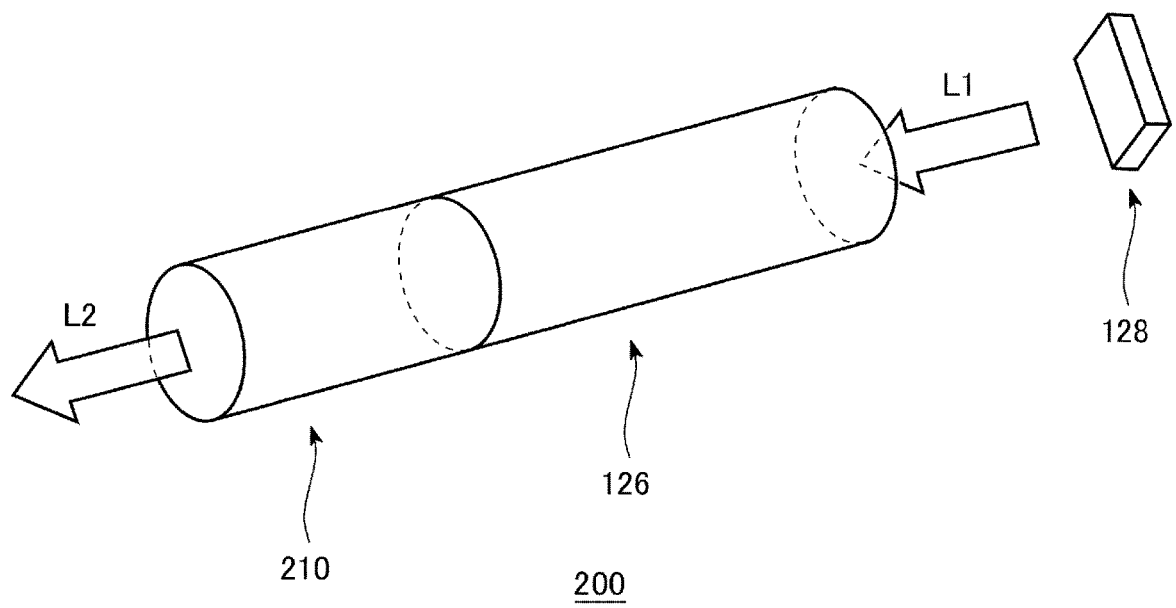
FIG. 16 is a schematic drawing showing a light emitting module including the fluorescent member according to Example 6.

FIG. 16 is a schematic drawing showing a light emitting module including the fluorescent member according to Example 6. The light emitting module 200 is configured by attaching the rod-shaped fluorescent member 210 described above to a tip of an optical fiber 126 having a diameter φ of 200 μm (the diameter of the columnar core is 50 μm, and the thickness of the cylindrical clad surrounding the core is 75 μm) by using a transparent silicone resin. A light emitting device 128 formed by an InGaN-based laser diode (LD) device configured to emit a light having a peak wavelength of 405 nm is provided at the other end (incidence end) of the optical fiber 126 via a spherical lens or a rod lens for light condensation and introduction, and a violet light is incident on the optical fiber 126. The light emitting device 128 as a light source may be other than an LD device. A semiconductor light emitting device such as a light emitting diode (LED) device and an electro luminescence (EL) device may be suitably used, but devices other than these may be used so long as a light source is capable of emitting highly directional light.

A portion of the violet light incident on the rod-shaped monocrystal fluorescent member 210 via the optical fiber 126 is incident on the chloroapatite monocrystal phosphor embodying the tubular second wavelength converter 114, a portion is incident on the chloroapatite monocrystal phosphor embodying the tubular third wavelength converter 116, and a portion is incident on the chloroapatite monocrystal phosphor embodying the hexagonal prism first wavelength converter 112.

The violet light incident on the second wavelength converter 114 is converted inside the second wavelength converter 114 into a blue light (λp=460 nm) exhibiting high directionality and is emitted from the second output part 114*b* as a highly directional blue light. Further, the violet light incident on the first wavelength converter 112 is converted inside the first wavelength converter 112 into a yellow light (λp=580 nm) exhibiting high directionality and is emitted from the first output part 112*b* as a highly directional yellow light. Further, the violet light incident on the third wavelength converter 116 is converted inside the third wavelength converter 116 into a yellow light (λp=580 nm) exhibiting high directionality and is emitted from the third output part 116*b* as a highly directional yellow light.

Figure 17:
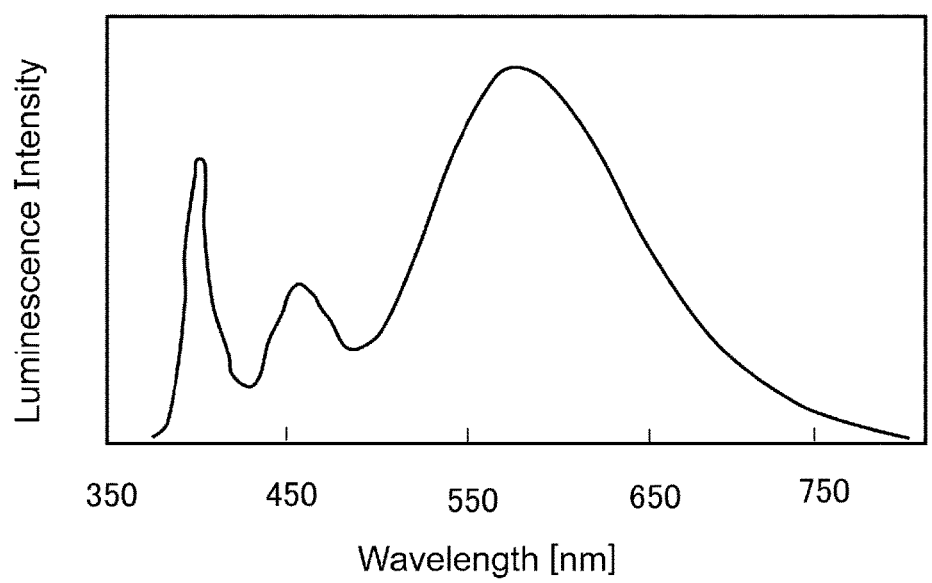
FIG. 17 shows an emission spectrum of a light emitting module.

The light emitted from the output surface 124 of the fluorescent member 210 is a highly directional white light L2 produced by a mixture of the blue light and the yellow light. FIG. 17 shows an emission spectrum of the light emitting module 200.

Example 7

Figure 18:
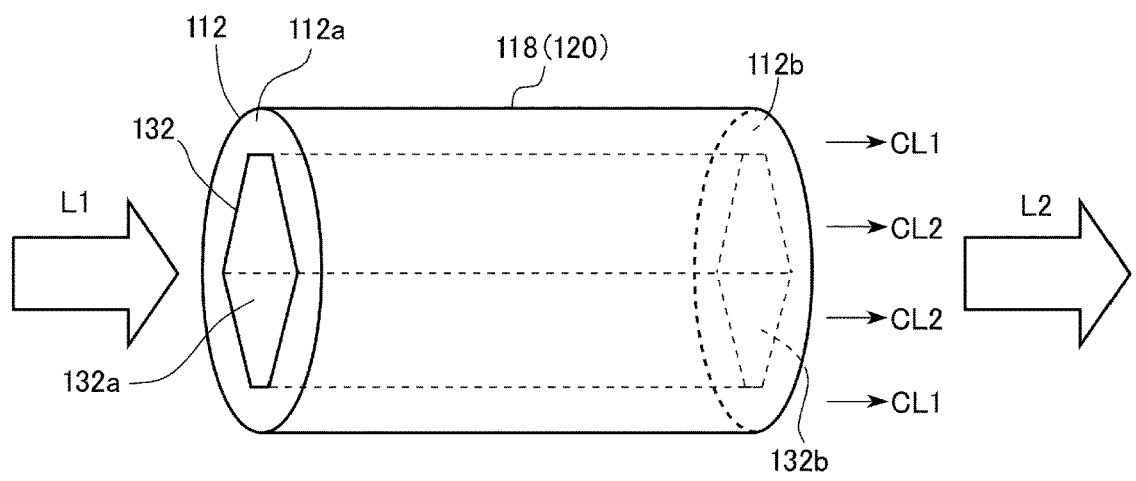
FIG. 18 is a schematic diagram of a fluorescent member according to Example 7.

FIG. 18 is a schematic diagram of a fluorescent member according to Example 7. In the following description, those features that are equivalent to the features of Example 6 are denoted by the same reference numerals and a description thereof is omitted as appropriate.

A fluorescent member 130 according to Example 7 includes a tubular first wavelength converter 112 and a columnar second wavelength converter 132 having a smaller outer diameter than the outer diameter of the first wavelength converter 112. The second wavelength converter 132 includes a second incidence part 132*a* on which the light L1 of the light source is incident and a second output part 132*b* from which a converted light CL2 of a second color subjected to wavelength conversion as a result of the excitation by the incident light is output. The second wavelength converter 132 is comprised of a material whereby the degree of scattering of the light of the light source incident via the second incidence part 132*a* and traveling toward the second output part 132*b* is smaller than in the case of a polycrystalline material.

The feature increases the proportion of the light traveling from the first incidence part 112*a* toward the first output part 112*b* in the first wavelength converter 112 and enhances the directionality of converted light CL1 of the first color emitted from the first output part 112*b*. The feature also increases the proportion of the light traveling from the second incidence part 132*a* toward the second output part 132*b* in the second wavelength converter 132 and enhances the directionality of converted light CL2 of the second color emitted from the second output part 132*b*.

By mixing the converted light CL1 of the first color and the converted light CL2 of the second color different from the first color, emission of highly directional light L2 of any of a variety of colors not realized by a single color is enabled.

In the fluorescent member 130 according to Example 7, the second wavelength converter 132 is a rod-shaped member. The second incidence part 132*a* is formed at one end of the member in the longitudinal direction, and the second output part 132*b* is formed at the other end of the member in the longitudinal direction. The feature aligns the directions of the light incident via the respective incidence parts as it passes through the respective rod-shaped members, enhancing the directionality of the light emitted from the respective output parts.

A description will now be given of the composition and the method of manufacturing of the wavelength converters in the fluorescent member 130 according to Example 7. In the fluorescent member 130 according to Example 7, a chloroapatite monocrystal phosphor is used as the second wavelength converter 132, and a chlorometasilicate monocrystal phosphor is used as the first wavelength converter 112.

[Manufacturing of Rod]

A description will now be given of a method of manufacturing the second wavelength converter 132. Starting materials including $CaCO_3$, $CaHPO_4 \cdot 2H_2O$, $Eu_2O_3$, $NH_4Cl$, and $CaCl_2$) were weighed such that the molar ratio thereof is $CaCO_3:CaHPO_4 \cdot 2H_2O:Eu_2O_3:NH_4Cl:CaCl_2=1.8:3.0:0.1:$ 1.0:5.0. The weighted materials were put into an alumina mortar to grind and mix the materials to obtain a base mixture.

The base mixture was put into an alumina crucible and heated to 1200° C. at a rate of temperature increase of 100° C./h. The heated mixture was calcinated (synthesized) in an electrical furnace of a reductive atmosphere for 10 hours at a temperature of 1200° C. and in a predetermined atmosphere ($H_2:N_2=5:95$). The temperature was then lowered to 800° C. at a cooling rate 5° C./h. The mixture was then cooled naturally to obtain a calcinated product. The calcinated product thus obtained was carefully cleaned with hot pure water and was filtered. The filtered product was dried for 1 hour at 120° C. to obtain a monocrystal phosphor.

The composition of the monocrystal phosphor is $Ca_5(PO_4)_3Cl:Eu^{2+}$. A solid hexagonal prism chloroapatite monocrystal phosphor (may be referred to as "columnar phosphor") having an outer diameter φ of 200 µm and a length of 60 mm and grown in the direction of the c-axis was obtained. The columnar phosphor exhibits an emission spectrum similar to that of the chloroapatite monocrystal phosphor according to Example 6. The chloroapatite monocrystal phosphor according to Example 7 is a phosphor that emits a blue light by being excited by an excitation light having a wavelength of 400 nm.

An $SiO_2$ film is formed on the surface of the columnar phosphor. More specifically, an $SiO_2$ target is used in an RF magnetron sputtering device. An $SiO_2$ film is formed in a thickness of 0.2 µm on the columnar phosphor heated to 200° C. under the condition of a degree of vacuum of 0.2 Pa ($Ar/O_2=50/5$ sccm) and a processing pressure of 1 Pa.

Further, a chlorometasilicate monocrystal phosphor is formed on the outer side surface of the columnar phosphor coated with $SiO_2$. The chlorometasilicate monocrystal phosphor thus formed represents the first wavelength converter 112. The chloroapatite monocrystal phosphor is a phosphor that emits a broad yellow light having a peak at the wavelength 580 nm by being excited by an excitation light having a wavelength of 405 nm.

To manufacture a chlorometasilicate monocrystal phosphor, starting materials including $SiO_2$, $CaCO_3$, $SrCl_2.2H_2O$, $Eu_2O_3$, and $NH_4Cl$ were weighed such that the molar ratio thereof is $SiO_2:CaCO_3:SrCl_2.2H_2O:Eu_2O_3:NH_4Cl=1.0:0.5:0.8:0.2:5.0$. The base mixture and the tubular phosphor coated with $SiO_2$ are weighed in equal amounts and mixed lightly in a mortar. The mixture is then mixed by dry air.

The base mixture was put into an alumina crucible and heated to 850° C. at a rate of temperature increase of 100° C./h. The heated mixture was calcinated (synthesized) in an electrical furnace of a reductive atmosphere for 40 hours at a temperature of 850° C. and in a predetermined atmosphere ($H_2:N_2=5:95$). The temperature was then lowered to 700° C. at a cooling rate 80° C./h. The mixture was then cooled naturally to obtain a calcinated product. The calcinated product thus obtained was carefully cleaned with hot pure water and was filtered. The filtered product was dried for 1 hour at 120° C.

In this way, a rod-shaped composite body having a diameter φ of 250 µm and a length of 60 mm in which the columnar phosphor coated with $SiO_2$ is wrapped by the chlorometasilicate monocrystal phosphor was obtained. The rod-shaped composite body is a phosphor that emits a white light by being excited by an excitation light having a wavelength of 405 nm.

[Shaping]

The rod-shaped composite body thus obtained was cut by a slicer into a length of 50 mm. The rod shape was formed by polishing the cut surface and the side surface.

[Side Surface Reflection Coating]

As in the case of the fluorescent member 210 of Example 6, the side surface 118 of the fluorescent member 130 is formed with the side surface reflection coating 120.

[Incidence Surface]

The configuration of the incidence surface of the fluorescent member 130 is similar to that of the incidence surface 122 of the fluorescent member 210 according to Example 6.

[Output Surface]

The configuration of the output surface of the fluorescent member 130 is similar to that of the output surface 124 of the fluorescent member 210 according to Example 6.

[Light Emitting Module]

The light emitting module including the fluorescent member according to Example 7 has a configuration similar to that of the light emitting module 200 according to Example 6 and emits a highly directional white light produced by a mixture of the blue light and the yellow light.

Example 8

Figure 19:
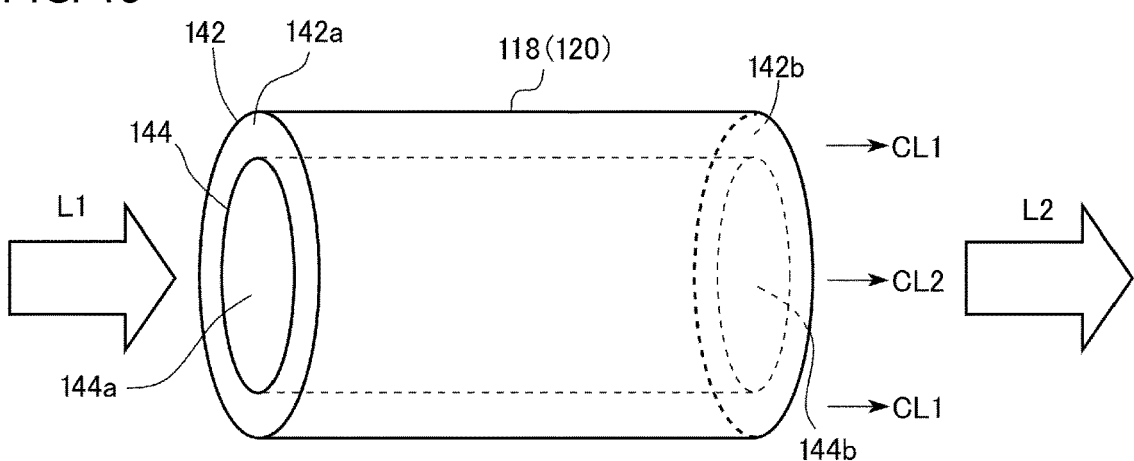
FIG. 19 is a schematic diagram of a fluorescent member according to Example 8.

FIG. 19 is a schematic diagram of a fluorescent member according to Example 8. In the following description, those features that are equivalent to the features of Example 6 and Example 7 are denoted by the same reference numerals and a description thereof is omitted as appropriate.

A fluorescent member 140 according to Example 8 includes a cylindrical first wavelength converter 142 and a columnar second wavelength converter 144 having a smaller outer diameter than the outer diameter of the first wavelength converter 142.

The first wavelength converter 142 includes an annular first incidence part 142a on which the light L1 of the light source is incident and an annular first output part 142b from which a converted light CL1 of a first color subjected to wavelength conversion as a result of the excitation by the incident light is output. The second wavelength converter 144 includes a second incidence part 144a on which the light L1 of the light source is incident and a second output part 144b from which a converted light CL2 of a second color subjected to wavelength conversion as a result of the excitation by the incident light is output.

The first wavelength converter 142 is comprised of a material whereby the degree of scattering of the light of the light source incident via the first incidence part 142a and traveling toward the first output part 142b is smaller than in the case of a polycrystalline material. The second wavelength converter 144 is comprised of a material whereby the degree of scattering of the light of the light source incident via the second incidence part 144a and traveling toward the second output part 144b is smaller than in the case of a polycrystalline material.

The feature increases the proportion of the light traveling from the first incidence part 142a toward the first output part 142b in the first wavelength converter 142 and enhances the directionality of converted light CL1 of the first color emitted from the first output part 142b. The feature also increases the proportion of the light traveling from the second incidence part 144a toward the second output part 144b in the second wavelength converter 144 and enhances the directionality of converted light CL2 of the second color emitted from the second output part 144b.

By mixing the converted light CL1 of the first color and the converted light CL2 of the second color different from the first color, emission of highly directional light L2 of any of a variety of colors not realized by a single color is enabled.

A description will now be given of the composition and the method of manufacturing of the wavelength converters in the fluorescent member 140 according to Example 8. In the fluorescent member 140 according to Example 8, a chlorometasilicate monocrystal phosphor is used as the second wavelength converter 144, and a chloroapatite monocrystal phosphor is used as the first wavelength converter 142.

[Manufacturing of Rod]

A description will first be given of a method of manufacturing the second wavelength converter 144. To manufacture a chlorometasilicate monocrystal phosphor, starting materials including $SiO_2$, $CaCO_3$, $SrCl_2.2H_2O$, $Eu_2O_3$, and $NH_4Cl$ were weighed such that the molar ratio thereof is $SiO_2$: $CaCO_3$:$SrCl_2.2H_2O$:$Eu_2O_3$:$NH_4Cl$=1.0:0.5:0.8:0.2:5.0. The base mixture is put into an alumina mortar to grind and mix the materials.

The base mixture was put into an alumina crucible and heated to 1000° C. at a rate of temperature increase of 100° C./h. The heated mixture was calcinated (synthesized) in an electrical furnace of a reductive atmosphere for 30 hours at a temperature of 1000° C. and in a predetermined atmosphere ($H_2$:$N_2$=5:95). The temperature was then lowered to 700° C. at a cooling rate 50° C./h. The mixture was cooled naturally to obtain a calcinated product. The calcinated product thus obtained was carefully cleaned with hot pure water and was filtered. The filtered product was dried for 1 hour at 120° C.

Figure 20:
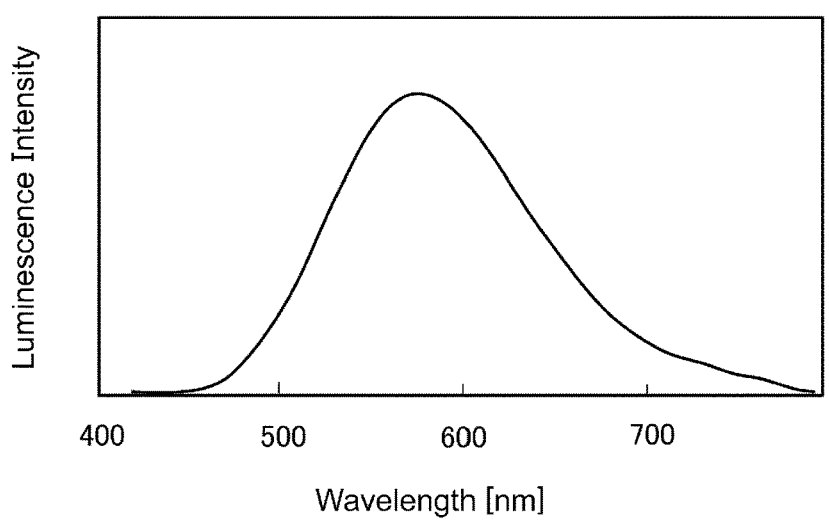
FIG. 20 shows an emission spectrum of the chlorometasilicate monocrystal phosphor according to Example 8.

In this way, a chlorometasilicate monocrystal phosphor grown to a grain size of 4 mm was obtained. The monocrystal phosphor thus obtained is cut by a slicer along the light axis direction under X-ray diffraction observation of the light axis direction in which birefringence is not exhibited. The monocrystal phosphor thus cut was ground and polished into a shape of a thickness of 100 μm. The polished product was cut by a slicer to a length of 3 mm and turned into a rod shape. The monocrystal phosphor is a phosphor that emits a broad yellow light having a peak near the wavelength 580 nm by being excited by an excitation light having a peak wavelength of 405 nm. FIG. 20 shows an emission spectrum of the chlorometasilicate monocrystal phosphor according to Example 8. As shown in FIG. 20, the chlorometasilicate monocrystal phosphor according to Example 8 is a phosphor that emits a yellow light by being excited by an excitation light having a wavelength of 405 nm. Hereinafter, this chlorometasilicate monocrystal phosphor rod may be referred to as a yellow rod phosphor.

An $SiO_2$ film is formed on the surface of the yellow rod phosphor. More specifically, a carrier gas produced by mixing oxygen with an organic silicon compound represented by tetramethoxysilan (TEOS; $Si(OCH_3)_4$) was used in a plasma CVD device, and an $SiO_2$ film was formed on the yellow rod phosphor heated to 200° C. in a thickness of 0.2 μm. Further, the yellow rod phosphor was irradiated by an infrared lamp for 3 minutes to make the formed film robust.

Further, a chloroapatite monocrystal phosphor is formed on the outer side surface of the yellow rod phosphor coated with $SiO_2$. The chloroapatite monocrystal phosphor thus formed represents the first wavelength converter 142. The chloroapatite monocrystal phosphor is a phosphor that emits a broad blue light having a peak at the wavelength 460 nm by being excited by an excitation light having a wavelength of 400 nm.

To describe the manufacturing method in further detail, calcium nitrate was dissolved in distilled water, and ethoxide phosphate was added (the total mol concentration of calcium and phosphorus; 0.05 mol/l). The solution was churned, and concentrated hydrochloric acid (1 mol of chlorine for 1 mol of calcium) was added. The yellow rod phosphor coated with $SiO_2$ was dispersed in this solution. The solution was dried for 2 hours at 60° C. to remove the distilled water. Crystallization was promoted by heating the product at 850° C. for 2 hours in the atmosphere to obtain a rod-shaped composite body having a diameter φ of 200 μm and a length of 4 mm in which the yellow rod phosphor coated with $SiO_2$ is wrapped by the chloroapatite monocrystal phosphor.

[Shaping]

The rod-shaped composite body thus obtained was cut by a slicer into a length of 3 mm. The rod shape was formed by polishing the cut surface and the side surface.

[Side Surface Reflection Coating]

As in the case of the fluorescent member 210 of Example 6, the side surface 118 of the fluorescent member 140 is formed with the side surface reflection coating 120.

[Incidence Surface]

The configuration of the incidence surface of the fluorescent member 140 is similar to that of the incidence surface 122 of the fluorescent member 210 according to Example 6.

[Output Surface]

The configuration of the output surface of the fluorescent member 140 is similar to that of the output surface 124 of the fluorescent member 210 according to Example 6.

[Light Emitting Module]

The light emitting module including the fluorescent member according to Example 8 has a configuration similar to that of the light emitting module 200 according to Example 6 and emits a highly directional white light produced by a mixture of the blue light and the yellow light.

Example 9

The configuration of the fluorescent member according to Example 9 is substantially identical to that of the fluorescent member 140 according to Example 8. First, the yellow rod phosphor is manufactured by a method similar to that of Example 8. An $SiO_2$ film is formed on the surface of the yellow rod phosphor. More specifically, a carrier gas produced by mixing oxygen with an organic silicon compound represented by tetramethoxysilan (TEOS; $Si(OCH_3)_4$) was used in a plasma CVD device provided with a high-frequency discharger, and an $SiO_2$ film was formed on the yellow rod phosphor heated to 300° C. in a thickness of 0.2 μm by irradiating the phosphor with discharge plasma at a high frequency of 14 MHz and a power of 2 W/cm$^2$.

Further, a chloroapatite monocrystal phosphor was formed on the outer side surface of the yellow rod phosphor coated with $SiO_2$. The chloroapatite monocrystal phosphor is a phosphor that emits a blue light having a peak at the wavelength 460 nm by being excited by an excitation light having a wavelength of 400 nm.

To describe the manufacturing method in further detail, calcium ethoxide was dissolved in distilled water, and phosphoric acid was added (the total mol concentration of calcium and phosphorus; 0.05 mol/l). The solution was churned, and concentrated hydrochloric acid (1 mol of chlorine for 1 mol of calcium) was added. The yellow rod phosphor coated with $SiO_2$ was dispersed in this solution. The solution was dried for 2 hours at 60° C. to remove the distilled water. Crystallization was promoted by heating the product at 850° C. for 2 hours in the atmosphere to obtain a rod-shaped composite body having a diameter φ of 200 μm and a length of about 4 mm in which the yellow rod phosphor coated with $SiO_2$ is wrapped by the chloroapatite monocrystal phosphor.

This is followed by executing the method similar to that of Example 8 to produce a light emitting module. Like the light emitting modules according to the examples described above, the light emitting module according to Example 9 emits a highly directional white light produced by a mixture of the blue light and the yellow light.

Example 10

Figure 21:
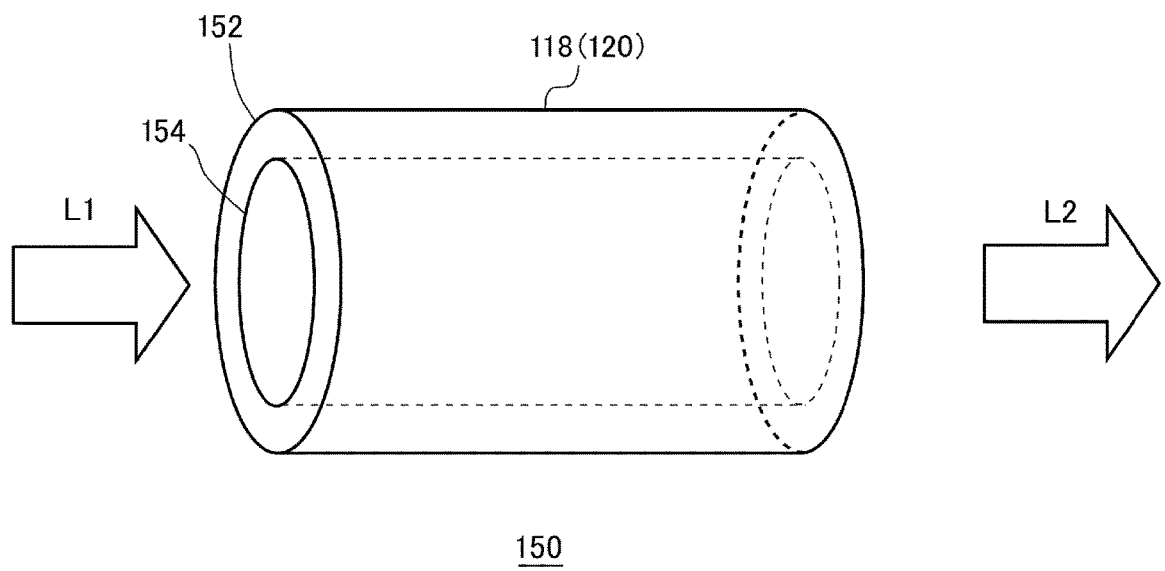
FIG. 21 is a schematic diagram of a fluorescent member according to Example 10.

FIG. 21 is a schematic diagram of a fluorescent member according to Example 10. In the following description, those features that are equivalent to the features of Examples 6~9 are denoted by the same reference numerals and a description thereof is omitted as appropriate.

A fluorescent member 150 according to Example 10 includes a cylindrical first wavelength converter 152 and a columnar second wavelength converter 154 having a smaller outer diameter than the outer diameter of the first wavelength converter 152.

A description will now be given of the composition and the method of manufacturing of the wavelength converters in the fluorescent member 150 according to Example 10. In the fluorescent member 150 according to Example 10, a nanocomposite phosphor is used as the second wavelength converter 154, and a chlorometasilicate monocrystal phosphor is used as the first wavelength converter 152.
[Manufacturing of Rod]

A description will first be given of a method of manufacturing the second wavelength converter 154. A $SiO_2$ fiber, $CaI_2$, $Eu_2O_3$, and $NH_4Cl$ are used as starting materials for the nanocomposite phosphor. The materials including $CaI_2$, $Eu_2O_3$, and $NH_4I$ are weighed such that the molar ratio thereof is $CaI_2:Eu_2O_3:NH_4I=0.1:0.004:0.1$. The base mixture is put into an alumina mortar to grind and mix the materials, whereupon three $SiO_2$ fibers (φ=200 μm, length=10 mm) are further mixed.

The base mixture was put into an alumina crucible and heated to 1000° C. at a rate of temperature increase of 100° C./h. The heated mixture was calcinated (synthesized) in an electrical furnace of a reductive atmosphere for 15 hours at a temperature of 1000° C. and in a predetermined atmosphere ($H_2:N_2=5:95$). The mixture was then cooled naturally to obtain a calcinated product. The calcinated product thus obtained was carefully cleaned with hot pure water and was filtered. The filtered product was dried for 1 hour at 120° C.

Figure 22:
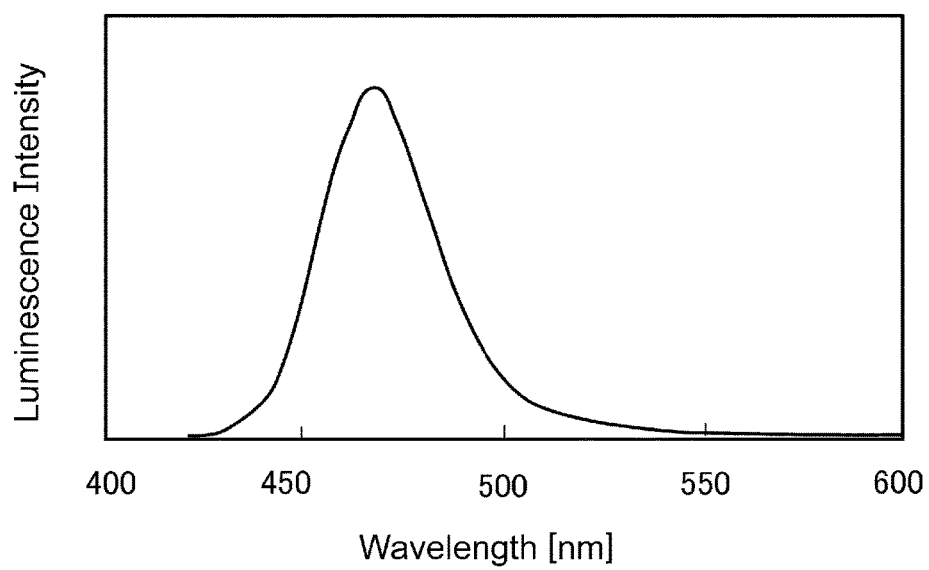
FIG. 22 shows an emission spectrum of the nanocomposite phosphor according to Example 10.

In this way, a nanocomposite phosphor in which fluorescent monocrystals (Ca,Eu)$I_2$ having a diameter of about 50 nm and adapted to emit a blue light are dispersed in the $SiO_2$ fiber having a diameter φ of 200 μm and a length of 10 mm was obtained (hereinafter, may be referred to as a "nanocomposite phosphor"). FIG. 22 shows an emission spectrum of the nanocomposite phosphor according to Example 10. As shown in FIG. 22, the nanocomposite phosphor according to Example 10 is a phosphor that emits a blue light having a peak near the wavelength 465 nm by being excited by an excitation light having a peak wavelength of 405 nm.

An $SiO_2$ film is formed on the surface of the nanocomposite phosphor. More specifically, a carrier gas produced by mixing oxygen with an organic silicon compound represented by tetramethoxysilan (TEOS; $Si(OCH_3)_4$) was used in a plasma CVD device, and an $SiO_2$ film was formed on the nanocomposite phosphor heated to 400° C. in a thickness of 0.2 μm.

Further, a chlorometasilicate monocrystal phosphor is formed on the outer side surface of the nanocomposite phosphor coated with $SiO_2$. The chlorometasilicate monocrystal phosphor thus formed represents the first wavelength converter 152. The chlorometasilicate monocrystal phosphor is a phosphor that emits a broad yellow light having a peak at the wavelength 580 nm by being excited by an excitation light having a wavelength of 405 nm.

To manufacture the chlorometasilicate monocrystal phosphor, starting materials including $SiO_2$, $CaCO_3$, $SrCl_2.2H_2O$, $Eu_2O_3$, and $NH_4Cl$ were weighed such that the molar ratio thereof is $SiO_2:CaCO_3:SrCl_2.2H_2O:Eu_2O_3:NH_4Cl=1.0:0.5:0.8:0.2:5.0$. The weighted materials were put into an alumina mortar to grind and mix the materials.

The base mixture and the nanocomposite phosphor coated with $SiO_2$ were put into an alumina crucible and heated to 850° C. at a rate of temperature increase of 100° C./h. The heated mixture was calcinated (synthesized) in an electrical furnace of a reductive atmosphere for 10 hours at a temperature of 850° C. and in a predetermined atmosphere ($H_2:N_2=5:95$). The temperature was then lowered to 700° C. at a cooling rate 50° C./h. The mixture was then cooled naturally to obtain a calcinated product. The calcinated product thus obtained was carefully cleaned with hot pure water and was filtered. The filtered product was dried for 1 hour at 120° C.

In this way, a rod-shaped composite having a diameter φ of 200 μm and a length of 10 mm in which the nanocomposite phosphor rod coated with $SiO_2$ is wrapped by the chlorometasilicate monocrystal phosphor was obtained.
[Shaping]

The rod-shaped composite body thus obtained was cut by a slicer into a length of 8 mm. The rod shape was formed by polishing the cut surface and the side surface.
[Side Surface Reflection Coating]

As in the case of the fluorescent member 210 of Example 6, the side surface 118 of the fluorescent member 150 is formed with the side surface reflection coating 120.
[Incidence Surface]

The configuration of the incidence surface of the fluorescent member 150 is similar to that of the incidence surface 122 of the fluorescent member 210 according to Example 6.
[Output Surface]

The configuration of the output surface of the fluorescent member 150 is similar to that of the output surface 124 of the fluorescent member 210 according to Example 6.
[Light Emitting Module]

The light emitting module including the fluorescent member according to Example 10 has a configuration similar to that of the light emitting module 200 according to Example 6, and the violet light incident on the rod via the optical fiber is converted by the nanocomposite phosphor rod (nanocomposite phosphor in which monocrystals (Ca, Eu)$I_2$ are dispersed) and the chlorometasilicate monocrystal phosphor into a white light exhibiting high directionality.

Example 11

Figure 23:
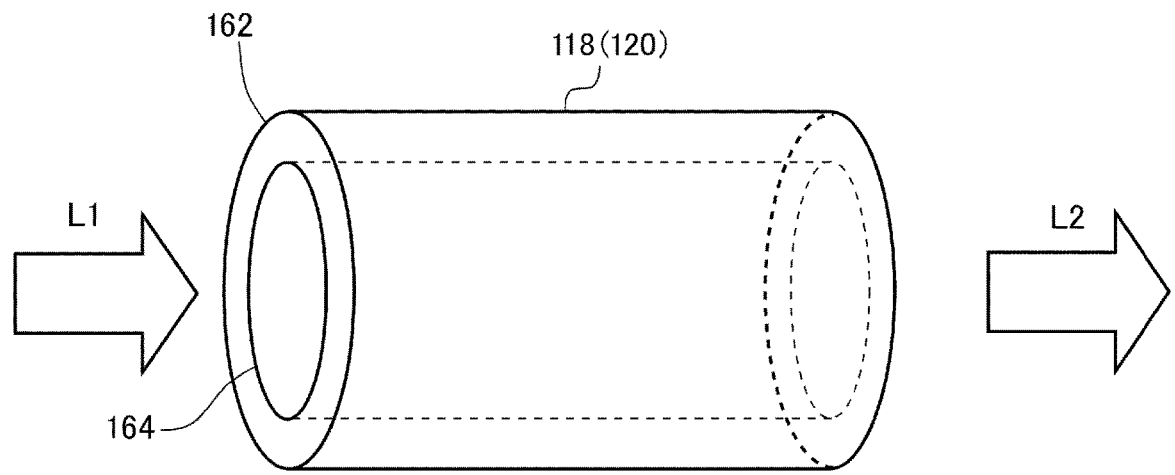
FIG. 23 is a schematic diagram of a fluorescent member according to Example 11.

FIG. 23 is a schematic diagram of a fluorescent member according to Example 11. In the following description, those features that are equivalent to the features of Examples 6~10 are denoted by the same reference numerals and a description thereof is omitted as appropriate.

A fluorescent member 160 according to Example 11 includes a cylindrical first wavelength converter 162 and a columnar second wavelength converter 164 having a smaller outer diameter than the outer diameter of the first wavelength converter 162.

A description will now be given of the composition and the method of manufacturing of the wavelength converters in the fluorescent member 160 according to Example 11. In the fluorescent member 160 according to Example 11, a chlorometasilicate monocrystal phosphor is used as the second wavelength converter 164, and a nanocomposite phosphor is used as the first wavelength converter 162.

[Manufacturing of Rod]

A description will first be given of a method of manufacturing the second wavelength converter 164. To manufacture a chlorometasilicate monocrystal phosphor, starting materials including $SiO_2$, $CaCO_3$, $SrCl_2.2H_2O$, $Eu_2O_3$, and $NH_4Cl$ were weighed such that the molar ratio thereof is $SiO_2$:$CaCO_3$:$SrCl_2.2H_2O$:$Eu_2O_3$:$NH_4Cl$=1.0:0.5:0.8:0.2:5.0. The base mixture is put into an alumina mortar to grind and mix the materials.

The base mixture was put into an alumina crucible and heated to 1000° C. at a rate of temperature increase of 100° C./h. The heated mixture was calcinated (synthesized) in an electrical furnace of a reductive atmosphere for 30 hours at a temperature of 1000° C. and in a predetermined atmosphere ($H_2$:$N_2$=5:95). The temperature was then lowered to 700° C. at a cooling rate 80° C./h. The mixture was cooled naturally to obtain a calcinated product. The calcinated product thus obtained was carefully cleaned with hot pure water and was filtered. The filtered product was dried for 1 hour at 120° C.

In this way, a chlorometasilicate monocrystal phosphor grown to a grain size of 8 mm was obtained. The crystal thus obtained is cut by a slicer along the light axis direction under X-ray diffraction observation of the light axis direction in which birefringence is not exhibited. The monocrystal phosphor thus cut was ground and polished into a shape of a thickness of 100 μm. The polished product was cut by a slicer to a length of 6 mm and turned into a rod shape. The monocrystal phosphor is a phosphor that emits a broad yellow light having a peak near the wavelength 580 nm by being excited by an excitation light having a peak wavelength of 405 nm.

An $SiO_2$ film is formed on the surface of the yellow rod phosphor. More specifically, a carrier gas produced by mixing oxygen with an organic silicon compound represented by tetramethoxysilan (TEOS; $Si(OCH_3)_4$) was used in a plasma CVD device, and an $SiO_2$ film was formed on the yellow rod phosphor heated to 200° C. in a thickness of 0.2 μm. Further, the yellow rod phosphor was irradiated by an infrared lamp for 3 minutes to make the formed film robust.

Further, a nanocomposite phosphor was formed on the outer side surface of the yellow rod phosphor coated with $SiO_2$. $SiO_2$, $CaI_2$, $Eu_2O_3$, and $NH_4Cl$ are used as starting materials for the nanocomposite phosphor. The materials including $SiO_2$, $CaI_2$, $Eu_2O_3$, and $NH_4I$ are weighed such that the molar ratio thereof is $SiO_2$:$CaI_2$:$Eu_2O_3$:$NH_4I$=1.0:0.1:0.004:0.1. The base mixture is put into an alumina mortar in a glove box of a dry nitrogen atmosphere to grind and mix the materials.

The base mixture and the yellow rod phosphor coated with $SiO_2$ were put into an alumina crucible and heated to 850° C. at a rate of temperature increase of 100° C./h. The heated mixture was calcinated (synthesized) in an electrical furnace of a reductive atmosphere for 5 hours at a temperature of 850° C. and in a predetermined atmosphere ($H_2$:$N_2$=5:95). The mixture was then cooled naturally to obtain a calcinated product. The calcinated product thus obtained was carefully cleaned with hot pure water and was filtered. The filtered product was dried for 1 hour at 120° C.

In this way, a rod-shaped composite having a diameter φ of 200 μm and a length of 8 mm in which the yellow rod phosphor coated with $SiO_2$ is wrapped by the nanocomposite phosphor rod was obtained.

[Shaping]

The rod-shaped composite body thus obtained was cut by a slicer into a length of 6 mm. The rod shape was formed by polishing the cut surface and the side surface.

[Side Surface Reflection Coating]

As in the case of the fluorescent member 210 of Example 6, the side surface 118 of the fluorescent member 160 is formed with the side surface reflection coating 120.

[Incidence Surface]

The configuration of the incidence surface of the fluorescent member 160 is similar to that of the incidence surface 122 of the fluorescent member 210 according to Example 6.

[Output Surface]

The configuration of the output surface of the fluorescent member 160 is similar to that of the output surface 124 of the fluorescent member 210 according to Example 6.

[Light Emitting Module]

The light emitting module including the fluorescent member according to Example 11 has a configuration similar to that of the light emitting module 200 according to Example 6, and the violet light incident on the rod via the optical fiber is converted by the nanocomposite phosphor rod (nanocomposite phosphor in which monocrystals (Ca, Eu)$I_2$ are dispersed) and the chlorometasilicate monocrystal phosphor into a white light exhibiting high directionality.

Example 12

Figure 24:
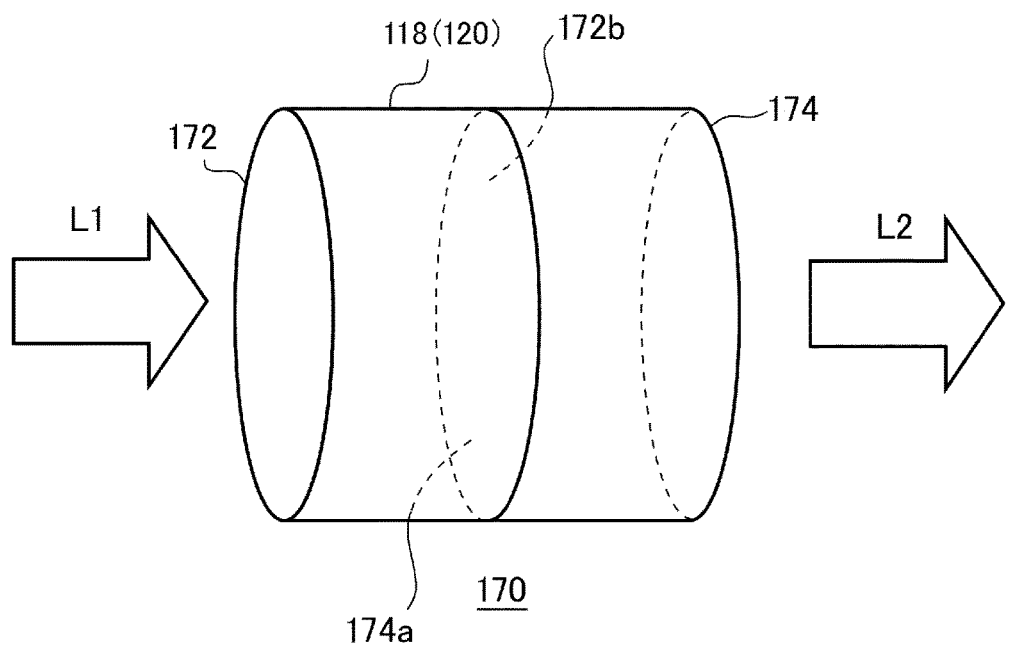
FIG. 24 is a schematic diagram of a fluorescent member according to Example 12.

FIG. 24 is a schematic diagram of a fluorescent member according to Example 12. In the following description, those features that are equivalent to the features of Examples 6~11 are denoted by the same reference numerals and a description thereof is omitted as appropriate.

A fluorescent member 170 according to Example 12 includes a columnar first wavelength converter 172 and a columnar second wavelength converter 174. In the fluorescent member 170, the diameter of the first wavelength converter 172 and the diameter of the second wavelength converter 174 are substantially identical. Further, a first output part 172b of the first wavelength converter 172 and a second incidence part 174a of the second wavelength converter 174 are provided to face each other.

A description will now be given of the composition and the method of manufacturing of the wavelength converters in the fluorescent member 170 according to Example 12. In the fluorescent member 170 according to Example 12, a chloroapatite monocrystal phosphor is used as the first wavelength converter 172, and a chlorometasilicate monocrystal phosphor is used as the second wavelength converter 174.

[Manufacturing of Rod]

A description will first be given of a method of manufacturing the second wavelength converter 174. To manufacture a chlorometasilicate monocrystal phosphor, starting materials including $SiO_2$, $CaCO_3$, $SrCl_2.2H_2O$, $Eu_2O_3$, and $NH_4Cl$ are weighed such that the molar ratio thereof is $SiO_2$:$CaCO_3$:$SrCl_2.2H_2O$:$Eu_2O_3$:$NH_4Cl$=1.0:0.5:0.8:0.2:5.0. The base mixture is put into an alumina mortar to grind and mix the materials.

The base mixture was put into an alumina crucible and heated to 1000° C. at a rate of temperature increase of 100°

C./h. The heated mixture was calcinated (synthesized) in an electrical furnace of a reductive atmosphere for 30 hours at a temperature of 1000° C. and in a predetermined atmosphere ($H_2:N_2=5:95$). The temperature was then lowered to 700° C. at a cooling rate 50° C./h. The mixture was cooled naturally to obtain a calcinated product. The calcinated product thus obtained was carefully cleaned with hot pure water and was filtered. The filtered product was dried for 1 hour at 120° C.

In this way, a chlorometasilicate monocrystal phosphor grown to a grain size of 8 mm was obtained. The monocrystal phosphor thus obtained is cut by a slicer along the light axis direction under X-ray diffraction observation of the light axis direction in which birefringence is not exhibited. The monocrystal phosphor thus cut was ground and polished into a shape of a thickness of 100 μm. The polished product was cut by a slicer to a length of 6 mm and turned into a rod shape. The monocrystal phosphor is a phosphor that emits a broad yellow light having a peak near the wavelength 580 nm by being excited by an excitation light having a peak wavelength of 400 nm. Hereinafter, this chlorometasilicate monocrystal phosphor rod may be referred to as a yellow rod phosphor.

Next, the chloroapatite monocrystal phosphor embodying the first wavelength converter 172 is manufactured. To manufacture the chloroapatite monocrystal phosphor, starting materials including $CaCO_3$, $CaHPO_4.2H_2O$, $Eu_2O_3$, $NH_4Cl$, and $CaCl_2$ are weighed such that the molar ratio thereof is $CaCO_3:CaHPO_4.2H_2O:Eu_2O_3:NH_4Cl:CaCl_2=1.8:3.0:0.1:1.0:5.0$. The base mixture is put into an alumina mortar to grind and mix the materials.

The base mixture was put into an alumina crucible and heated to 1200° C. at a rate of temperature increase of 100° C./h. The heated mixture was calcinated (synthesized) in an electrical furnace of a reductive atmosphere for 10 hours at a temperature of 1200° C. and in a predetermined atmosphere ($H_2:N_2=5:95$). The temperature was then lowered to 800° C. at a cooling rate 5° C./h. The mixture was then cooled naturally to obtain a calcinated product. The calcinated product thus obtained was carefully cleaned with hot pure water and was filtered. The filtered product was dried for 1 hour at 120° C. to obtain a monocrystal phosphor.

The composition of the monocrystal phosphor is $Ca_5(PO_4)_3Cl:Eu^{2+}$. A solid hexagonal prism chloroapatite monocrystal phosphor (hereinafter, may be referred to as a "columnar phosphor") having a length of 8 mm and grown in the direction of the c-axis was obtained. The columnar phosphor exhibits an emission spectrum similar to that of the chloroapatite monocrystal phosphor according to Example 6. The hexagonal prism chloroapatite monocrystal phosphor thus obtained was cut by a slicer into a length of 6 mm and also cut to into a thickness φ of 100 μm. The rod shape was formed by polishing the cut surface and the side surface. Hereinafter, the chloroapatite monocrystal phosphor rod may be referred to as a blue rod phosphor.

The surface of the yellow rod phosphor and the surface of the blue rod phosphor are bonded at a normal temperature. More specifically, the phosphors are polished to a surface roughness Ra on the bonding surface of 1 nm or less. The bonding surfaces are placed in a high vacuum ($\sim 10^{-5}$ Pa or less) to face each other vertically and define a uniform gap (2 mm). The oxidized film layers and adsorbed molecules on the two material surfaces are etched by an argon beam. Subsequently, the bonding surfaces are mated, pressurized, and bonded. Alternatively, the bonding surfaces may be bonded by optical contact bonding and heated at 600° C. for 1 hour to increase the bonding strength.

[Shaping]

The rod-shaped composite body thus bonded was cut by a slicer into a length of 10 mm. The rod shape was formed by polishing the cut surface and the side surface to a shape of a thickness of 100 μm.

[Side Surface Reflection Coating]

As in the case of the fluorescent member 210 of Example 6, the side surface 118 of the fluorescent member 170 is formed with the side surface reflection coating 120.

[Incidence Surface]

The configuration of the incidence surface of the fluorescent member 170 is similar to that of the incidence surface 122 of the fluorescent member 210 according to Example 6.

[Output Surface]

The configuration of the output surface of the fluorescent member 170 is similar to that of the output surface 124 of the fluorescent member 210 according to Example 6.

[Light Emitting Module]

The light emitting module including the fluorescent member according to Example 12 has a configuration similar to that of the light emitting module 200 according to Example 6 and emits a highly directional white light produced by a mixture of the blue light and the yellow light.

Example 13

Figure 25:
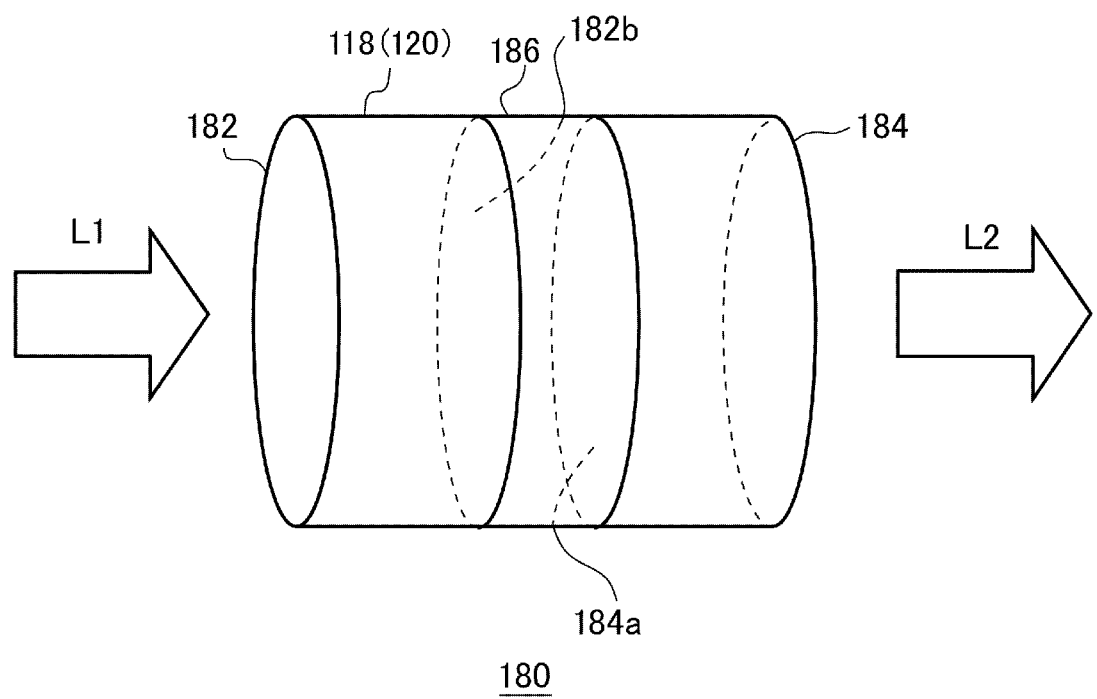
FIG. 25 is a schematic diagram of a fluorescent member according to Example 13.

FIG. 25 is a schematic diagram of a fluorescent member according to Example 13. In the following description, those features that are equivalent to the features of Examples 6~7 are denoted by the same reference numerals and a description thereof is omitted as appropriate.

A fluorescent member 180 according to Example 13 includes a columnar first wavelength converter 182, a columnar second wavelength converter 184, and a columnar buffer layer 186 provided between the first wavelength converter 182 and second wavelength converter 184. In the fluorescent member 180, the diameters of the first wavelength converter 182, the second wavelength converter 184, and the buffer layer 186 are substantially identical. Further, a first output part 182*b* of the first wavelength converter 182 and a second incidence part 184*a* of the second wavelength converter 184 are provided to face each other, sandwiching the buffer layer 186.

A description will now be given of the composition and the method of manufacturing of the wavelength converters in the fluorescent member 180 according to Example 13. In the fluorescent member 180 according to Example 13, a chloroapatite monocrystal phosphor is used as the first wavelength converter 182, and a chlorometasilicate monocrystal phosphor is used as the second wavelength converter 184.

[Manufacturing of Rod]

First, the second wavelength converter 184 is manufactured. The method of manufacturing the second wavelength converter 184 is similar to that of the second wavelength converter 174 according to Example 12.

Next, the chloroapatite monocrystal phosphor embodying the first wavelength converter 182 is manufactured. The method of manufacturing the first wavelength converter 182 is similar to that of the first wavelength converter 172 according to Example 12.

The buffer layer 186 is provided between the first wavelength converter 182 and the second wavelength converter 184 and bonded thereto. The buffer layer 186 has a rod shape having a thickness φ of 250 μm and a length of 1 mm. The outer shape is formed by polishing the cut surface and the side surface. Silicate glass, quartz, or fluoride glass based on SiO$_2$ is suitably used for the rod.

First, the first wavelength converter 182 and the buffer layer 186 are bonded. More specifically, the bonding surfaces are polished and cleaned, and are then spin-coated with a sol-gel material to a thickness of 0.3 μm. Subsequently, the bonding surfaces are dried quickly in a vacuum and are brought into contact with each other. A jig is used to sandwich the bonding surfaces such that interference stripes cannot be observed. The bonding surfaces are heated at 350° C. for 2 hours and then cooled before removing the jig. Further, the second wavelength converter 184 is bonded by a method similar to the above method to a rod-shaped stack in which the first wavelength converter 182 and the buffer layer 186 are bonded. The buffer layer 186 may be bonded to the first wavelength converter 182 and the second wavelength converter 184 simultaneously.

[Shaping]

The rod-shaped composite body thus bonded was cut by a slicer into a length of 10 mm. The cut surface and the side surface was polished to a shape of a thickness of 250 μm to form the rod shape.

[Side Surface Reflection Coating]

As in the case of the fluorescent member 210 of Example 6, the side surface 118 of the fluorescent member 180 is formed with the side surface reflection coating 120.

[Incidence Surface]

The configuration of the incidence surface of the fluorescent member 180 is similar to that of the incidence surface 122 of the fluorescent member 210 according to Example 6.

[Output Surface]

The configuration of the output surface of the fluorescent member 180 is similar to that of the output surface 124 of the fluorescent member 210 according to Example 6.

[Light Emitting Module]

The light emitting module including the fluorescent member according to Example 13 has a configuration similar to that of the light emitting module 200 according to Example 6 and emits a highly directional white light produced by a mixture of the blue light and the yellow light.

(Usage of Light Emitting Module)

The light emitting modules according to the examples above can produce highly directional light. Highly directional light can be used in a variety of fields such as medical equipment, optical equipment, and communication light sources. In particular, a light source capable of emitting a white light is applicable to illumination more efficient than LEDs or backlight for a display.

Because high beams can be obtained efficiently, highly directional light sources capable of saving more energy and more compact than related-art laser light sources are realized. A description will now be given of examples of applications.

(1) Photo Dynamic Therapy

An oncotropic photosensitive substance is injected intravenously to distinguish between a tumor in a focus of disease and a normal cell. After several hours, a bronchoscope is used to irradiate the focus of disease from the highly directional light source. This allows the position of the focus of disease to be determined accurately.

(2) Phototherapy to Alleviate Depression

A highly directional light is projected via the earhole. This can enhance the effect of alleviating depression even if the duration of irradiation is short.

(3) Light Source for Small Devices Such as Wearable Terminals

The light emitting modules according to the examples above are applicable as energy-saving and compact highly directional light sources.

(4) High-Luminance Lamp

The light emitting modules according to the examples above are capable of emitting light from a small area and outputting a high beam and so can be used in light sources of lamps with higher luminance than that of the related art. In particular, the light emitting modules can be used in automobile lamps in which power saving and size reduction are required.

(5) Others

The light emitting modules according to the examples above can be used in devices to illuminate a very small portion in a projector, an optical microscope, a fluorescence microscope, etc. By using the light emitting modules in light sources of laser pointers, the light is prevented from being blurred at a great distance (e.g., when the laser pointer is pointed at a huge screen). The light emitting modules can also be used as light sources of illumination used in a laser show.

Described above is an explanation based on an exemplary embodiment. The embodiment is intended to be illustrative only and it will be understood by those skilled in the art that various modifications to constituting elements and processes could be developed and that such modifications are also within the scope of the present invention.

What is claimed is:

1. A fluorescent member comprising:
   a wavelength converter including an incident part on which a light of a light source is incident and an output part from which a converted light subjected to wavelength conversion as a result of excitation by an incident light is output; and
   a reflecting part provided in at least a portion of a surface of the wavelength converter, wherein
   the wavelength converter is made of a monocrystal material,
   the monocrystal material is an optically anisotropic birefringence crystal, and
   an angle formed by a principal axis of the birefringence crystal, which is a direction in which birefringence does not occur, and a straight line connecting the incidence part and the output part is within ±5°.

2. The fluorescent member according to claim 1, wherein the wavelength converter is a rod-shaped member where the incidence part and the output part are formed at respective ends of the member in a longitudinal direction.

3. The fluorescent member according to claim 2, wherein an aspect ratio of the wavelength converter is 10-100.

4. The fluorescent member according to claim 2, wherein the wavelength converter is shaped in a polygonal column or a cylinder, and the reflecting part is provided on a side surface different from the incidence part and the output part.

5. A light emitting module comprising:
   a light source; and
   a wavelength converter including an incidence part on which a light of the light source is incident and an output part from which a converted light subjected to wavelength conversion as a result of excitation by an incident light is output, wherein
   the wavelength converter is made of a monocrystal material,
   the monocrystal material is an optically anisotropic birefringence crystal, and an angle formed by a principal axis of the birefringence crystal, which is a direction in which birefringence does not occur, and a straight line connecting the incidence part and the output part is within ±5°.

6. The light emitting module according to claim 5, wherein
the wavelength converter is a rod-shaped member where the incidence part and the output part are formed at respective ends of the member in a longitudinal direction.

7. The light emitting module according to claim 6, wherein
an aspect ratio of the wavelength converter is 10-100.

8. The light emitting module according to claim 6, further comprising:
a reflecting part provided in at least a portion of a surface of the wavelength converter, wherein
the wavelength converter is shaped in a polygonal column or a cylinder, and the reflecting part is provided on a side surface different from the incidence part and the output part.

9. A light emitting module comprising:
a light source;
a wavelength converter including an incidence part on which a light of the light source is incident, an output part from which a converted light subjected to wavelength conversion as a result of excitation by an incident light is output and a side surface different from the incidence part and the output part; and
a heat dissipation part provided to cover at least a portion of the side surface, wherein
the wavelength converter is made of a monocrystal material and configured to impart directionality to the light of the light source incident via the incidence part,
the monocrystal material is an optically anisotropic birefringence crystal, and
an angle formed by a principal axis of the birefringence crystal, which is a direction in which birefringence does not occur, and a straight line connecting the incidence part and the output part is within ±5°.

10. The light emitting module according to claim 9, wherein
a material having a thermal conductivity of 50 [W/m·K] or higher is used for the heat dissipation part.

11. The light emitting module according to claim 9, further comprising:
a reflecting part provided between the side surface and the heat dissipation part, wherein
the reflecting part is configured to internally reflect the light of the light source incident on the wavelength converter, and a material having a visible light reflectance of 80% or higher is used for the reflecting part.

12. The light emitting module according to claim 9, wherein
the wavelength converter is comprised of a material whereby a degree of scattering of the light of the light source incident via the incidence part and traveling toward the output part is smaller than a degree of the light of the light source incident via the incidence part and traveling toward the side surface.

13. The light emitting module according to claim 9, wherein
the wavelength converter is a rod-shaped member where the incidence part and the output part are formed at respective ends of the member in a longitudinal direction.

14. The light emitting module according to claim 9, wherein
an aspect ratio of the wavelength converter is 10-100.

15. The light emitting module according to claim 9, wherein
the wavelength converter is shaped in a polygonal column or a cylinder.

* * * * *